United States Patent
Kim

(10) Patent No.: US 12,453,231 B2
(45) Date of Patent: Oct. 21, 2025

(54) PIXEL, DISPLAY DEVICE INCLUDING THE SAME, AND METHOD OF MANUFACTURING DISPLAY DEVICE

(71) Applicant: Samsung Display Co., LTD., Yongin-si (KR)

(72) Inventor: Dong Woo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 438 days.

(21) Appl. No.: 18/058,237

(22) Filed: Nov. 22, 2022

(65) Prior Publication Data

US 2023/0361247 A1    Nov. 9, 2023

(30) Foreign Application Priority Data

May 4, 2022  (KR) .......................... 10-2022-0055638

(51) Int. Cl.
*H10H 29/14* (2025.01)
*H10H 20/819* (2025.01)
(Continued)

(52) U.S. Cl.
CPC ........ *H10H 29/142* (2025.01); *H10H 20/819* (2025.01); *H10H 20/831* (2025.01);
(Continued)

(58) Field of Classification Search
CPC .... H10H 29/14; H10H 29/142; H10H 20/032; H10H 20/819; H10H 20/831; H10H 20/8314; H10H 20/857; H10D 86/021; H10D 86/441; H10D 86/481; H01L 25/0753; H01L 2225/065
See application file for complete search history.

(56) References Cited

U.S. PATENT DOCUMENTS 10,580,946 B2   3/2020  Im et al.
10,797,212 B2   10/2020 Im et al.
(Continued)

FOREIGN PATENT DOCUMENTS

KR   10-2021-0074456 A   6/2021
KR   10-2021-0075289 A   6/2021
(Continued)

*Primary Examiner* — Scott B Geyer
(74) *Attorney, Agent, or Firm* — Womble Bond Dickinson (US) LLP

(57) ABSTRACT

A display device comprises a substrate divided into emission and non-emission areas, a storage capacitor, a first insulating layer, a first light emitting element and a second light emitting element, a bank in the non-emission area, and defining an opening corresponding to the emission area, a first pixel electrode electrically connected to a first end of the first light emitting element, a second pixel electrode electrically connected to a second end of the second light emitting element, an intermediate electrode between the first pixel electrode and the second pixel electrode, surrounding at least a portion of the first pixel electrode, and electrically connected to a second end of the first light emitting element and to a first end of the second light emitting element, and a sub-electrode electrically connected to a lower electrode of the storage capacitor through a contact hole, and overlapping the first pixel electrode.

13 Claims, 21 Drawing Sheets

(51) Int. Cl.
*H10H 20/831* (2025.01)
*H01L 25/075* (2006.01)
*H01L 25/16* (2023.01)
*H10D 86/40* (2025.01)
*H10H 20/01* (2025.01)

(52) U.S. Cl.
CPC ........ *H01L 25/0753* (2013.01); *H01L 25/167* (2013.01); *H01L 2225/065* (2013.01); *H10D 86/481* (2025.01); *H10H 20/032* (2025.01)

(56) References Cited

U.S. PATENT DOCUMENTS

| | | | |
|---|---|---|---|
| 11,088,197 B2 | 8/2021 | Kang et al. | |
| 2021/0272943 A1 | 9/2021 | Lee et al. | |
| 2022/0406763 A1* | 12/2022 | Yang | H10H 20/01 |
| 2023/0006119 A1* | 1/2023 | Oh | H01L 21/768 |
| 2023/0045654 A1* | 2/2023 | Moon | H10D 86/60 |
| 2023/0361259 A1* | 11/2023 | Yun | H10D 86/60 |

FOREIGN PATENT DOCUMENTS

| | | |
|---|---|---|
| KR | 10-2021-0075292 A | 6/2021 |
| KR | 10-2021-0095774 A | 8/2021 |
| KR | 10-2021-0109699 A | 9/2021 |

* cited by examiner

PIXEL, DISPLAY DEVICE INCLUDING THE SAME, AND METHOD OF MANUFACTURING DISPLAY DEVICE

CROSS-REFERENCE TO RELATED APPLICATION

The application claims priority to, and the benefit of, Korean Patent Application No. 10-2022-0055638, filed May 4, 2022, which is hereby incorporated by reference for all purposes as if fully set forth herein.

BACKGROUND

1. Field

The present disclosure relates to a pixel, a display device including the same, and a method of manufacturing the display device.

2. Description of the Related Art

In recent years, as interest in information displays increases, research and development on display devices are continuously conducted.

SUMMARY

An aspect of the present disclosure provides a pixel including a sub-capacitor that comprises a sub-electrode located on a bank, and a first pixel electrode that overlaps the sub-electrode and that is connected in parallel to a storage capacitor.

Another aspect of the present disclosure provides a display device including the pixel.

Another aspect of the present disclosure provides a method of manufacturing the display device.

However, aspects of the present disclosure are not limited to the above-described aspects, and may be variously extended without departing from the spirit and scope of the present disclosure.

A display device according to embodiments of the present disclosure may include a substrate divided into an emission area and a non-emission area, a storage capacitor above the substrate, and including a lower electrode and an upper electrode overlapping each other with an insulating layer interposed therebetween, a first insulating layer above the storage capacitor, a first light emitting element and a second light emitting element above the first insulating layer of the emission area, a bank in the non-emission area, and defining an opening corresponding to the emission area, a first pixel electrode electrically connected to a first end of the first light emitting element, a second pixel electrode electrically connected to a second end of the second light emitting element, an intermediate electrode including a portion positioned between the first pixel electrode and the second pixel electrode in a plan view, surrounding at least a portion of the first pixel electrode, and electrically connected to a second end of the first light emitting element and to a first end of the second light emitting element, and a sub-electrode above the bank, electrically connected to the lower electrode of the storage capacitor through a contact hole, and overlapping the first pixel electrode above the bank.

The display device may further include a second insulating layer directly on the first light emitting element and the second light emitting element, and exposing the first end and the second end of each of the first light emitting element and the second light emitting element, and a third insulating layer covering the intermediate electrode, and extending over the bank.

The first pixel electrode may include a portion overlapping the sub-electrode with the third insulating layer interposed therebetween above the bank.

An area where the first pixel electrode and the sub-electrode overlap may correspond to a sub-capacitor.

The first pixel electrode may be electrically connected to the upper electrode of the storage capacitor.

The display device may further include a driving transistor above the substrate, and electrically connected to the storage capacitor and to the sub-capacitor, wherein the storage capacitor and the sub-capacitor are electrically connected in parallel to each other between a gate electrode of the driving transistor and the first pixel electrode.

The first pixel electrode and the second pixel electrode may be provided at a same layer.

The intermediate electrode may be provided on a different layer from the first pixel electrode and the second pixel electrode.

The display device may further include a first alignment electrode under the first insulating layer, and electrically connected to the first pixel electrode, and a second alignment electrode under the first insulating layer, spaced apart from the first alignment electrode, and electrically connected to the second pixel electrode.

The bank may be above the first insulating layer in the non-emission area.

The first insulating layer may be above the bank in the non-emission area.

At least one of the first alignment electrode and the second alignment electrode may include a portion in contact with an upper surface of the sub-electrode.

A method of manufacturing a display device according to embodiments of the present disclosure may include forming a pixel circuit layer of a pixel including an emission area and a non-emission area on a substrate, forming a first alignment electrode and a second alignment electrode spaced apart from each other above the pixel circuit layer, forming, in the non-emission area, a bank defining an opening corresponding to the emission area, providing and aligning a light emitting element above the pixel circuit layer in the emission area, forming a sub-electrode above the bank, forming an intermediate electrode electrically connected to a first end of the light emitting element, forming an insulating layer including a portion extending over the bank and covering the intermediate electrode and the sub-electrode, and forming a pixel electrode connected to a second end of the light emitting element above a portion of the insulating layer to overlap the sub-electrode.

A portion where the pixel electrode and the sub-electrode overlap above the bank may form a sub-capacitor.

The pixel circuit layer may include a storage capacitor.

The pixel electrode may include a first pixel electrode electrically connected to an electrode of the storage capacitor and overlapping the sub-electrode, and a second pixel electrode spaced from the first pixel electrode and electrically connected to a power source line for receiving a driving power source.

The first pixel electrode and the second pixel electrode may be concurrently patterned.

The storage capacitor and the sub-capacitor may be electrically connected to each other in parallel.

The forming the bank may include forming a contact hole passing through the bank by an etching process, wherein the sub-electrode is electrically connected to an electrode of the storage capacitor through the contact hole.

A pixel according to embodiments of the present disclosure may include a storage capacitor above a substrate, and including a lower electrode and an upper electrode overlapping each other, a first insulating layer above the storage capacitor, a first light emitting element and a second light emitting element above the first insulating layer in an emission area, a bank in a non-emission area, and defining an opening corresponding to the emission area, a first pixel electrode electrically connected to a first end of the first light emitting element, a second pixel electrode electrically connected to a second end of the second light emitting element, an intermediate electrode including a portion positioned between the first pixel electrode and the second pixel electrode in a plan view, surrounding at least a portion of the first pixel electrode, and electrically connected to a second end of the first light emitting element and to a first end of the second light emitting element, and a sub-electrode above the bank, electrically connected to the lower electrode of the storage capacitor through a contact hole, and overlapping the first pixel electrode above the bank.

BRIEF DESCRIPTION OF THE DRAWINGS

The accompanying drawings, which are included to provide a further understanding of the present disclosure, and which are incorporated in, and constitute a part of, this specification, illustrate embodiments of the present disclosure, and, together with the description, serve to explain aspects of the present disclosure.

DETAILED DESCRIPTION

Figure 1:
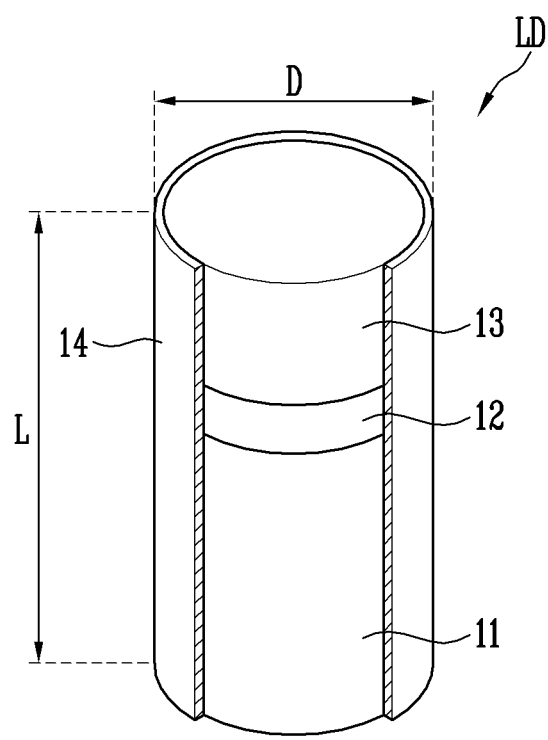
FIG. 1 is a perspective view schematically illustrating a light emitting element according to embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
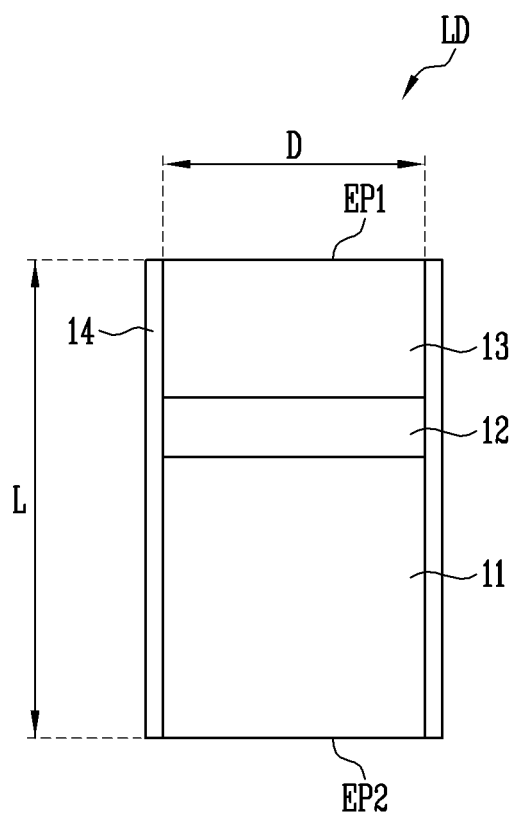
FIG. 2 is a cross-sectional view illustrating an example of the light emitting element of FIG. 1.

FIG. 1 is a perspective view schematically illustrating a light emitting element according to embodiments of the present disclosure. FIG. 2 is a cross-sectional view illustrating an example of the light emitting element of FIG. 1.

The type and/or shape of a light emitting element LD is not limited to the embodiments shown in FIGS. 1 and 2.

Referring to FIGS. 1 and 2, the light emitting element LD may include a first semiconductor layer 11, a second semiconductor layer 13, and an active layer 12 interposed between the first and second semiconductor layers 11 and 13. For example, the light emitting element LD may be implemented as a light emitting laminate (or a laminated pattern) in which the first semiconductor layer 11, the active layer 12, and the second semiconductor layer 13 are sequentially stacked.

The light emitting element LD may be provided in a shape extending in one direction. When a direction in which the light emitting element LD extends is referred to as a longitudinal direction, the light emitting element LD may include a first end EP1 and a second end EP2 along the longitudinal direction. One of the first semiconductor layer 11 and the second semiconductor layer 13 may be positioned at the first end EP1 of the light emitting element LD, and the other of the first semiconductor layer 11 and the second semiconductor layer 13 may be positioned at the second end EP2 of the light emitting element LD. For example, the second semiconductor layer 13 may be positioned at the first end EP1 of the light emitting element LD, and the first semiconductor layer 11 may be positioned at the second end EP2 of the light emitting element LD.

The light emitting element LD may be provided in various shapes. For example, as shown in FIG. 1, the light emitting element LD may have a rod-like shape, a bar-like shape, or a column-like shape that is long in the longitudinal direction (or that has an aspect ratio greater than 1). As another example, the light emitting element LD may have a rod-like shape, a bar-like shape, or a column-like shape that is short in the longitudinal direction (or that has an aspect ratio less than 1). As another example, the light emitting element LD may have a rod-like shape, a bar-like shape, or a column-like shape having an aspect ratio of 1.

The light emitting element LD may include, for example, a light emitting diode (LED) manufactured in an ultra-small size having a diameter D and/or a length L of a nano-scale (or nano-meter) to a micro-scale (or micro-meter).

The first semiconductor layer 11 may include, for example, at least one n-type semiconductor layer. For example, the first semiconductor layer 11 may be an n-type semiconductor layer including any one semiconductor material of InAlGaN, GaN, AlGaN, InGaN, AlN, and InN, and doped with a first conductive dopant (or an n-type dopant), such as Si, Ge, Sn, or the like. However, the material constituting the first semiconductor layer 11 is not limited thereto, and the first semiconductor layer 11 may be formed of various other materials.

The active layer 12 may be located on the first semiconductor layer 11 and may be formed in a single- or multiple-quantum well structure. For example, when the active layer 12 is formed in a multi-quantum well structure, the active layer 12 may have a structure in which a barrier layer, a strain reinforcing layer, and a well layer are periodically and repeatedly stacked as one unit. Because the strain reinforcing layer has a smaller lattice constant than the barrier layer, a strain applied to the well layer, for example, a compressive strain, may be further strengthened. However, the structure of the active layer 12 is not limited to the above-described embodiments.

The active layer 12 may emit light having a wavelength of about 400 nm to about 900 nm, and a double hetero structure may be applied. In one or more embodiments, a clad layer doped with a conductive dopant may be formed on the upper and/or lower portions of the active layer 12 in the longitudinal direction of the light emitting element LD. For example, the clad layer may be formed of an AlGaN layer, an InAlGaN layer, a GaAs layer, or the like. According to one or more embodiments, a material, such as AlGaN, InAlGaN, GaAs, or the like may be used to form the active layer 12. In addition, various other materials may be used to form the active layer 12. The active layer 12 may include a first surface in contact with the first semiconductor layer 11 and a second surface in contact with the second semiconductor layer 13.

In one or more embodiments, the color (or output color) of the light emitting element LD may be determined according to the wavelength of light emitted from the active layer 12. The color of the light emitting element LD may determine the color of a corresponding pixel. For example, the light emitting element LD may emit red light, green light, or blue light.

When an electric field that is greater than a voltage (e.g., predetermined voltage) is applied to both ends of the light emitting element LD, the light emitting element LD may emit light while electron-hole pairs are combined in the active layer 12. By controlling the light emitting of the light emitting element LD using this principle, the light emitting element LD can be used as a light source (or light emitting source) of various light emitting devices including pixels of a display device.

The second semiconductor layer 13 may be located on the second surface of the active layer 12, and may include a semiconductor layer of a different type from that of the first semiconductor layer 11. For example, the second semiconductor layer 13 may include at least one p-type semiconductor layer. For example, the second semiconductor layer 13 may include a p-type semiconductor layer including at least one semiconductor material of InAlGaN, GaN, AlGaN, InGaN, AlN, and InN, and doped with a second conductive dopant (or p-type dopant), such as Mg, Zn, Ca, Sr, Ba, or the like. However, the material constituting the second semiconductor layer 13 is not limited thereto. In addition, various other materials may be used to form the second semiconductor layer 13.

Although one or more embodiments in which each of the first semiconductor layer 11 and the second semiconductor layer 13 is composed of one layer is shown, the present disclosure is not limited thereto. In one or more embodiments, depending on the material of the active layer 12, each of the first semiconductor layer 11 and the second semiconductor layer 13 may further include at least one or more layers, for example, a clad layer and/or a tensile strain barrier reducing (TSBR) layer. The TSBR layer may be a strain relief layer located between semiconductor layers having different lattice structures to serve as a buffer to reduce a lattice constant difference. The TSBR layer may be formed of a p-type semiconductor layer, such as p-GaInP, p-AlInP, p-AlGaInP, or the like, but the present disclosure is not limited thereto.

According to one or more embodiments, the light emitting element LD may further include a contact electrode (hereinafter, referred to as a first contact electrode) located on the second semiconductor layer 13 in addition to the first semiconductor layer 11, the active layer 12, and the second semiconductor layer 13 described above. In addition, according to one or more other embodiments, the light emitting element LD may further include another contact electrode (hereinafter, referred to as a second contact electrode) located on one end of the first semiconductor layer 11.

Each of the first and second contact electrodes may be an ohmic contact electrode, but the present disclosure is not limited thereto. According to one or more embodiments, the first and second contact electrodes may be Schottky contact electrodes.

In one or more embodiments, the light emitting element LD may further include an insulating film 14 (or an insulating thin film). However, according to one or more embodiments, the insulating film 14 may be omitted, or may be provided to cover only a portion of the first semiconductor layer 11, the active layer 12, and the second semiconductor layer 13.

The insulating film 14 may reduce or prevent the likelihood of an electrical short circuit that may occur when the active layer 12 contacts a conductive material other than the first and second semiconductor layers 11 and 13. In addition, the insulating film 14 may reduce or minimize surface defects of the light emitting element LD to improve the lifespan and light emitting efficiency of the light emitting element LD. In addition, when a plurality of light emitting elements LD are located adjacent to each other, the insulating film 14 may reduce or prevent the likelihood an unwanted short circuit that may occur between the light emitting elements LD. The presence or absence of the insulating film 14 may not be limited as long as the active layer 12 can be prevented from being short-circuited with an external conductive material.

The insulating film 14 may be provided in a form that entirely surrounds an outer peripheral surface of the light emitting laminate including the first semiconductor layer 11, the active layer 12, and the second semiconductor layer 13.

The insulating film 14 may include a transparent insulating material. For example, the insulating film 14 may include at least one insulating material selected from the group consisting of silicon oxide (SiOx), silicon nitride (SiNx), silicon oxynitride (SiOxNy), aluminum oxide (AlOx), titanium oxide (TiOx), hafnium oxide (HfOx), titanium strontium oxide (SrTiOx), cobalt oxide (CoxOy), magnesium oxide (MgO), zinc oxide (ZnOx), ruthenium oxide (RuOx), nickel oxide (NiO), tungsten oxide (WOx), tantalum oxide (TaOx), gadolinium oxide (GdOx), zirconium oxide (ZrOx), gallium oxide (GaOx), vanadium oxide (VxOy), ZnO:Al, ZnO:B, InxOy:H, niobium oxide (NbxOy), magnesium fluoride (MgFx), aluminum fluoride (AlFx), alucone polymer film, titanium nitride (TiN), tantalum nitride (TaN), aluminum nitride (AlNx), gallium nitride (GaN), tungsten nitride (WN), hafnium nitride (HfN), niobium nitride (NbN), gadolinium nitride (GdN), zirconium nitride (ZrN), vanadium nitride (VN), and the like. However, the present disclosure is not limited thereto, and various other materials having insulating properties may be used as the material of the insulating film 14.

The insulating film 14 may be provided in a form of a single layer or may be provided in a form of a multi-layer including a double layer.

The above-described light emitting element LD may be used as a light emitting source (or light source) of various display devices. The light emitting element LD may be manufactured through a surface treatment process. For example, when a plurality of light emitting elements LD are mixed in a fluid solution (or solvent) and supplied to each pixel area (for example, an emission area of each pixel or an emission area of each sub-pixel), each of the light emitting elements LD may be surface-treated so that the light emitting elements LD are uniformly sprayed without being non-uniformly aggregated in the solution.

An emission unit (or a light emitting device) including the above-described light emitting element LD may be used in various types of electronic devices requiring a light source, such as a display device. For example, when a plurality of light emitting elements LD are located in a pixel area of each pixel of a display panel, the light emitting elements LD may be used as light sources of each pixel. However, fields to which the light emitting element LD may be applied are not limited to the above-described examples. For example, the light emitting element LD may also be used in other types of electronic devices requiring a light source, such as a lighting device.

Figure 3:
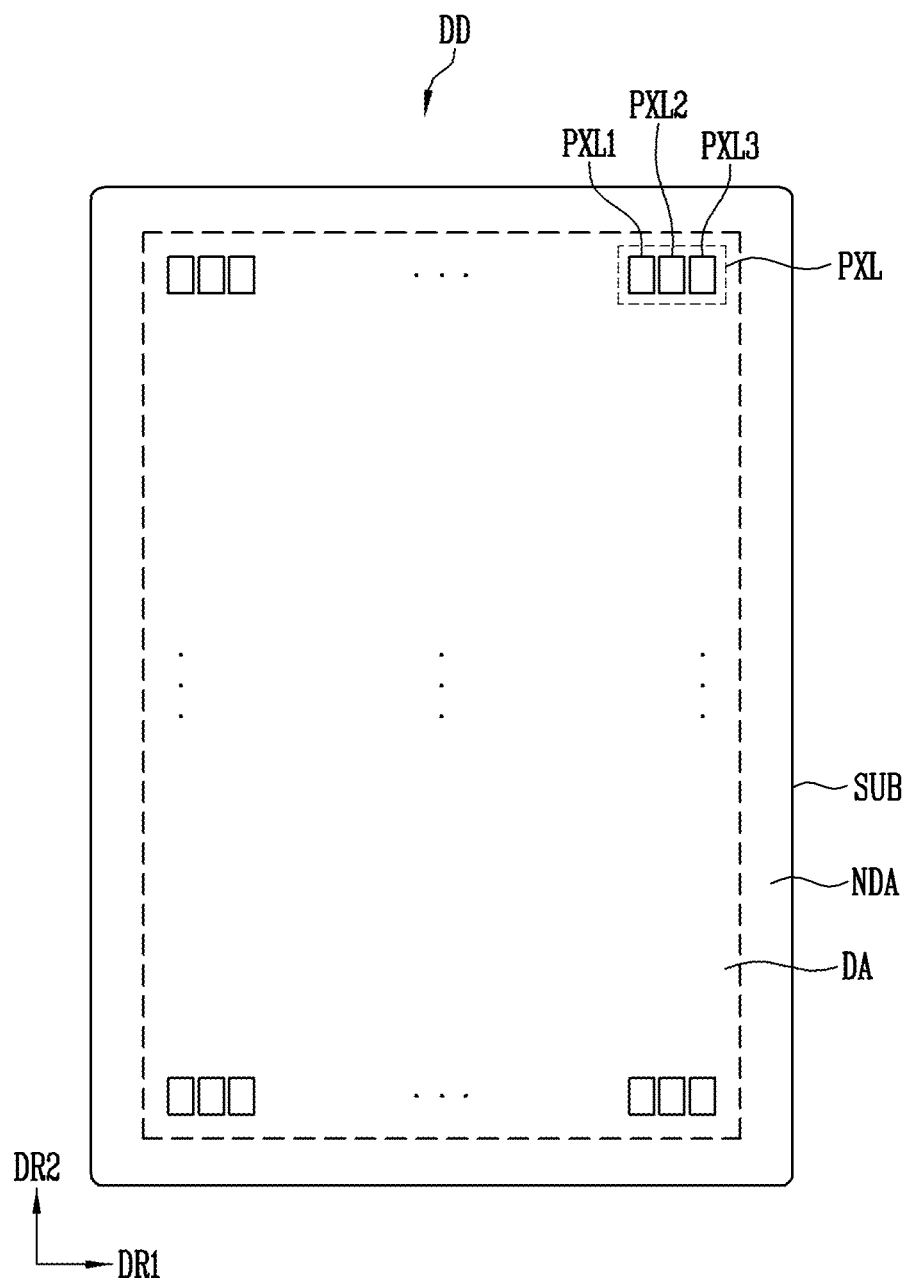
FIG. 3 is a plan view illustrating a display device according to embodiments of the present disclosure.

FIG. 3 is a plan view illustrating a display device according to embodiments of the present disclosure.

If a display device DD is an electronic device having a display surface on at least one surface, such as a smartphone, a television, a tablet PC, a video phone, an e-book reader, a desktop PC, a laptop PC, a workstation, a server, a PDA, a medical device, a camera, or a wearable device, the present disclosure can be applied.

Referring to FIGS. 1 to 3, the display device DD may include a substrate SUB, pixels PXL1, PXL2, and PXL3 provided on the substrate SUB and each including at least one light emitting element LD, a driving unit provided on the substrate SUB and driving the pixels PXL1, PXL2, and PXL3, and a wiring unit connecting the pixels PXL1, PXL2, and PXL3 to the driving unit.

The substrate SUB may include a display area DA and a non-display area NDA.

The display area DA may be an area in which the pixels PXL1, PXL2, and PXL3 displaying an image are provided. The non-display area NDA may be an area in which the driving unit for driving the pixels PXL1, PXL2, and PXL3 and a portion of the wiring unit connecting the pixels PXL1, PXL2, and PXL3 to the driving unit are provided.

The non-display area NDA may be located adjacent to the display area DA. The non-display area NDA may be provided on at least one side of the display area DA. For example, the non-display area NDA may surround an outer portion (or an edge) of the display area DA.

The wiring unit may electrically connect the driving unit and the pixels PXL1, PXL2, and PXL3. The wiring unit may provide signals to the pixels PXL1, PXL2, and PXL3, and may include a fan-out line connected to signal lines connected to each of the pixels PXL1, PXL2, and PXL3, for example, a scan line, a data line, an emission control line, and the like.

The substrate SUB may include a transparent insulating material to transmit light. The substrate SUB may be a rigid substrate or a flexible substrate.

Each of the pixels PXL1, PXL2, and PXL3 may be provided within the display area DA on the substrate SUB.

The pixels PXL1, PXL2, and PXL3 may include a first pixel PXL1, a second pixel PXL2, and a third pixel PXL3. In one or more embodiments, the first pixel PXL1 may be a red pixel, the second pixel PXL2 may be a green pixel, and the third pixel PXL3 may be a blue pixel. However, the present disclosure is not limited thereto, and the pixels PXL1, PXL2, and PXL3 may emit light of colors other than red, green, and blue, respectively.

Each of the pixels PXL1, PXL2, and PXL3 may include at least one light emitting element LD driven by a corresponding scan signal and data signal. The light emitting element LD may have a size as small as a nano-scale (or nano-meter) to a micro-scale (or micro-meter), and may be connected in parallel to adjacent light emitting elements, but the present disclosure is not limited thereto. The light emitting element LD may constitute a light source of each of the pixels PXL1, PXL2, and PXL3.

Figure 4:
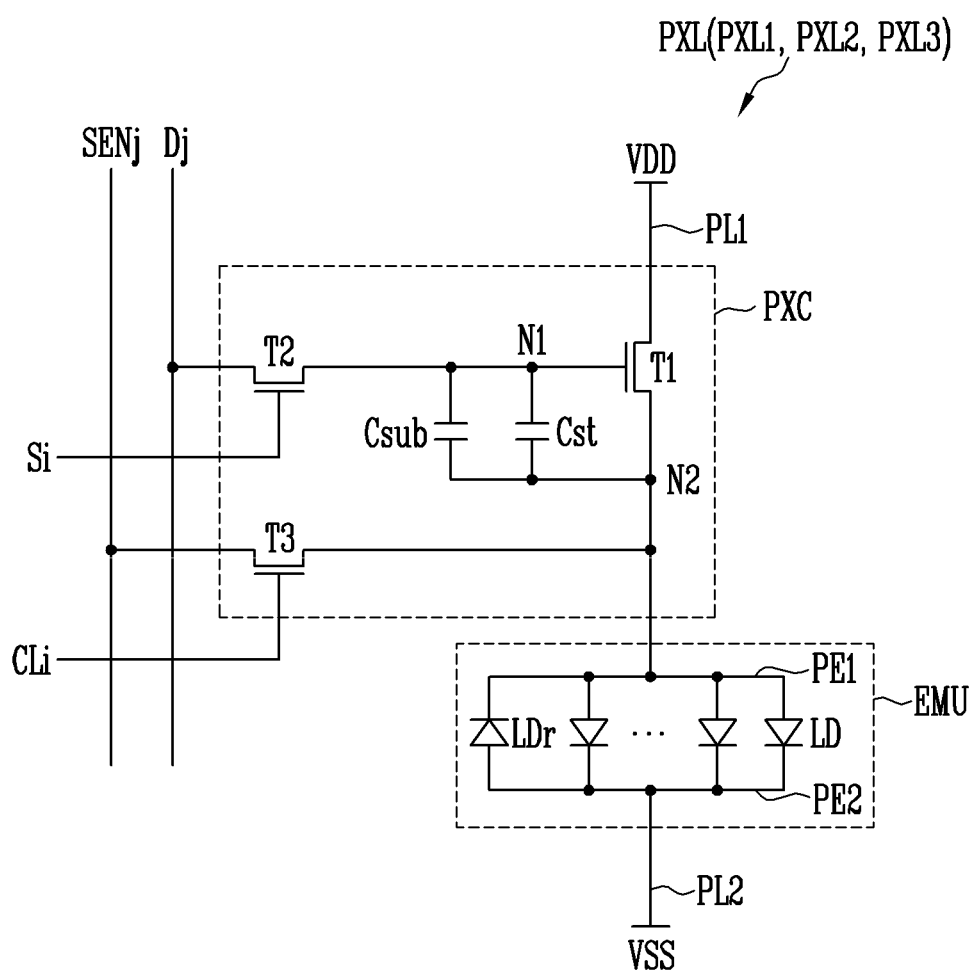
FIG. 4 is a circuit diagram illustrating an example of a pixel included in the display device of FIG. 3.

FIG. 4 is a circuit diagram illustrating an example of a pixel included in the display device of FIG. 3.

In the following embodiments, when the first pixel PXL1, the second pixel PXL2, and the third pixel PXL3 are arbitrarily referred to, they may be referred to as a pixel PXL.

Referring to FIGS. 1, 2, 3, and 4, the pixel PXL may include a pixel circuit PXC and an emission unit EMU.

In one or more embodiments, the emission unit EMU may include light emitting elements LD connected in parallel between a first power source line PL1 and a second power source line PL2. Each of the light emitting elements LD may be connected to a first pixel electrode PE1 and a second pixel electrode PE2. Each of the light emitting elements LD connected in parallel in the same direction (for example, a forward direction) between the first pixel electrode PE1 and the second pixel electrode PE2 may be an effective light source.

The light emitting element LD may be connected between the first power source line PL1 to which a voltage of a first driving power source VDD is applied and the second power source line PL2 to which a voltage of a second driving power source VSS is applied. In one or more embodiments, the first pixel electrode PE1 may be an anode, and the second pixel electrode PE2 may be a cathode.

The light emitting element LD may include one end connected to a first transistor T1 through the first pixel electrode PE1, and another end connected to the second driving power source VSS through the second pixel electrode PE2. The first driving power source VDD and the second driving power source VSS may have different potentials. For example, the first driving power source VDD may be set as a high potential power source, and the second driving power source VSS may be set as a low potential power source. In this case, a potential difference between the first and second driving power sources VDD and VSS may be set to be greater than or equal to a threshold voltage of light emitting elements during an emission period of the pixel PXL.

In one or more embodiments, the emission unit EMU may further include at least one ineffective light source, for example, a reverse light emitting element LDr. The reverse light emitting element LDr may be connected between the first and second pixel electrodes PE1 and PE2 in an opposite direction to the light emitting elements LD. The reverse light emitting element LDr may be maintained in a deactivated state even when a driving voltage (e.g., predetermined driving voltage, for example, a forward driving voltage) is applied between the first and second pixel electrodes PE1 and PE2. Accordingly, substantially no current may flow through the reverse light emitting element LDr.

The pixel circuit PXC may be connected to a scan line Si (where i may be a positive integer) and a data line Dj (where j may be a positive integer) of the pixel PXL. Also, the pixel circuit PXC may be connected to a control line CLi and a sensing line SENj of the pixel PXL. For example, when the pixel PXL is located in an i-th row and a j-th column in the display area DA, the pixel circuit PXC of the pixel PXL may be connected to an i-th scan line Si, a j-th data line Dj, an i-th control line CLi, and a j-th sensing line SENj.

The pixel circuit PXC may include first to third transistors T1 to T3, a storage capacitor Cst, and a sub-capacitor Csub.

The first transistor T1 may be a driving transistor for controlling a driving current applied to the emission unit EMU. The first transistor T1 may be connected between the first driving power source VDD and the light emitting element LD. A gate electrode of the first transistor T1 may be connected to a first node N1.

The first transistor T1 may control the amount of the driving current applied from the first driving power source VDD to the emission unit EMU through a second node N2 according to a voltage applied to the first node N1.

The second transistor T2 may be a switching transistor that selects the pixel PXL in response to a scan signal and that activates the pixel PXL. The second transistor T2 may be connected between the data line Dj and the first node N1. A gate electrode of the second transistor T2 may be connected to the scan line Si.

The second transistor T2 may be turned on by the scan signal supplied to the scan line Si, and may transfer a data signal to the gate electrode of the first transistor T1.

The third transistor T3 may obtain a sensing signal through the sensing line SENj by connecting the first transistor T1 to the sensing line SENj, and may detect characteristics of the pixel PXL, such as a threshold voltage of the first transistor T1 or the like, using the sensing signal. Information on the characteristics of the pixel PXL may be used to convert image data so that a characteristic deviation between pixels can be compensated.

The third transistor T3 may be connected between the sensing line SENj and the second node N2. A gate electrode of the third transistor T3 may be connected to the control line CLi.

In one or more embodiments, a voltage of an initialization power source may be provided for a period (e.g., predetermined period) through the sensing line SENj. The third transistor T3 may be turned on when a sensing control signal is supplied from the control line CLi to transfer the voltage of the initialization power source to the second node N2. Accordingly, a voltage stored in the storage capacitor Cst connected to the second node N2 may be initialized.

The storage capacitor Cst may be connected between the first node N1 and the second node N2. The storage capacitor Cst may be charged with a data voltage corresponding to the data signal supplied to the first node N1 during one frame period. Accordingly, the storage capacitor Cst may store a voltage corresponding to a difference between a voltage of the gate electrode of the first transistor T1 and a voltage of the second node N2.

For example, the storage capacitor Cst may include an upper electrode (a first capacitor electrode) electrically connected to the first pixel electrode PE1, and may include a lower electrode electrically connected to the gate electrode of the first transistor T1.

The sub-capacitor Csub may be connected between the first node N1 and the second node N2. For example, the sub-capacitor Csub may be electrically connected in parallel with the storage capacitor Cst between the gate electrode of the first transistor T1 and the first pixel electrode PE1. Accordingly, equivalent capacitance for charging the data voltage may be increased by the storage capacitor Cst and the sub-capacitor Csub. That is, the sub-capacitor Csub may serve as an auxiliary to increase the capacitance (equivalent capacitance) of the storage capacitor Cst.

Accordingly, in a high-resolution display device DD having a high pixel density, a charging rate of the data voltage may be improved, and short-range uniformity (SRU) indicating luminance/color uniformity between neighboring pixels may be improved.

Figure 5:
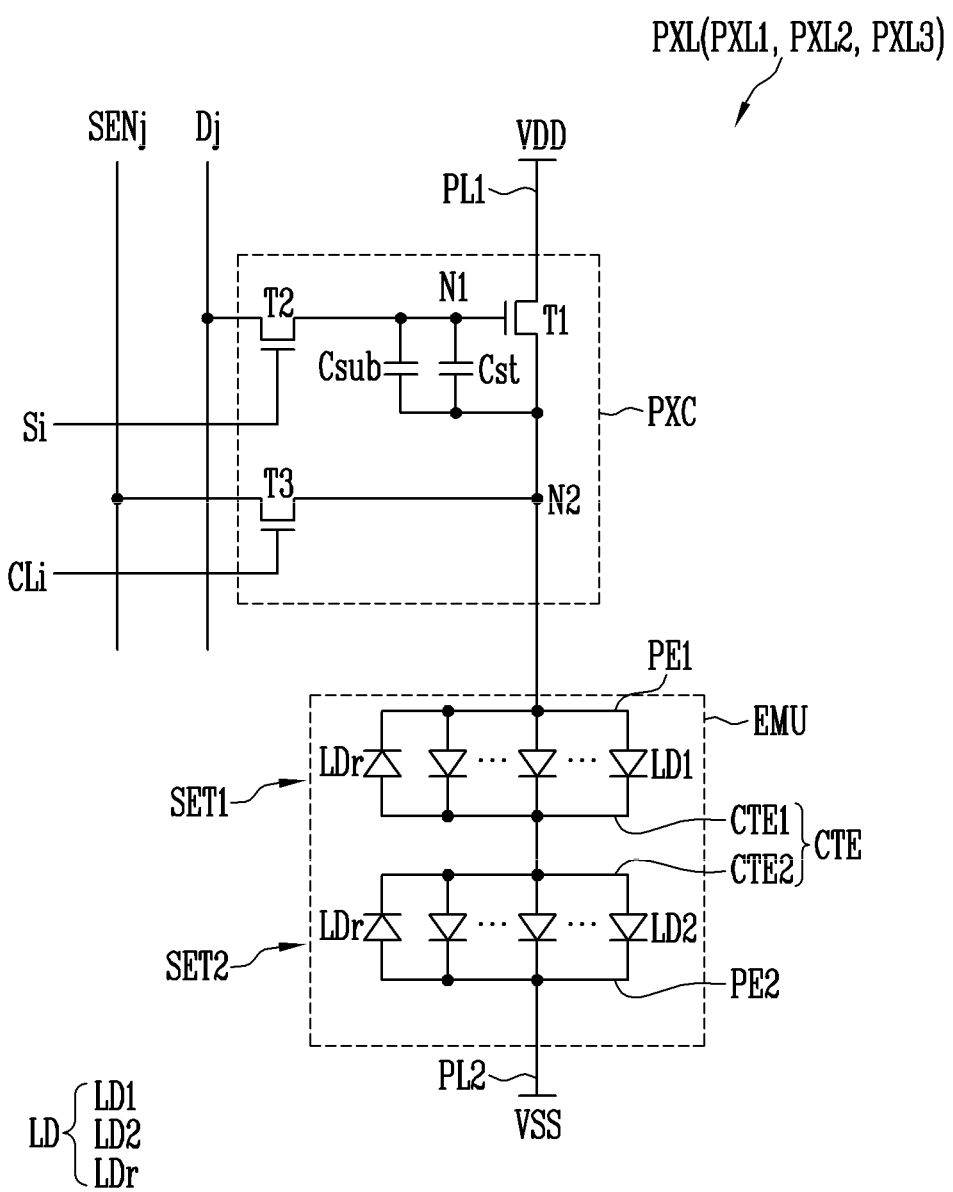
FIG. 5 is a circuit diagram illustrating an example of the pixel included in the display device of FIG. 3.

FIG. 5 is a circuit diagram illustrating an example of the pixel included in the display device of FIG. 3.

In FIG. 5, the same reference numerals are used for the same or similar components as those described with reference to FIG. 4, and duplicate descriptions thereof will be omitted. The pixel PXL of FIG. 5 may be substantially the same as, or similar to, the pixel PXL of FIG. 4 except for a configuration of the emission unit EMU.

Referring to FIGS. 1, 2, 3, and 5, the pixel PXL may include a pixel circuit PXC and an emission unit EMU.

In one or more embodiments, the emission unit EMU may be configured to include at least one series stage including a plurality of light emitting elements LD connected in parallel. For example, as shown in FIG. 5, the emission unit EMU may be configured in a series/parallel mixed structure.

The emission unit EMU may include first and second series stages SET1 and SET2 connected in series between first and second driving power sources VDD and VSS. Each of the first and second series stages SET1 and SET2 may include two respective electrodes PE1 and CTE1, and CTE2 and PE2 constituting an electrode pair of a corresponding series stage, and the plurality of light emitting elements LD connected in parallel in the same direction between a respective pair of electrodes PE1 and CTE1, and CTE2 and PE2.

The first series stage SET1 (or a first stage) may include a first pixel electrode PE1, a first intermediate electrode CTE1, and at least one first light emitting element LD1 connected between the first pixel electrode PE1 and the first intermediate electrode CTE1. Also, the first series stage SET1 may include a reverse light emitting element LDr connected in an opposite direction to the first light emitting element LD1 between the first pixel electrode PE1 and the first intermediate electrode CTE1.

The second series stage SET2 (or a second stage) may include a second intermediate electrode CTE2, a second pixel electrode PE2, and at least one second light emitting element LD2 connected between the second intermediate electrode CTE2 and the second pixel electrode PE2. Also, the second series stage SET2 may include a reverse light emitting element LDr connected in an opposite direction to the second light emitting element LD2 between the second intermediate electrode CTE2 and the second pixel electrode PE2.

The first intermediate electrode CTE1 and the second intermediate electrode CTE2 may be electrically and/or physically connected to each other. The first intermediate electrode CTE1 and the second intermediate electrode CTE2 may constitute an intermediate electrode CTE electrically connecting the first series stage SET1 and the second series stage SET2.

In the above-described embodiments, the first pixel electrode PE1 of the first series stage SET1 may be an anode of the pixel PXL, and the second pixel electrode PE2 of the second series stage SET2 may be a cathode of the pixel PXL.

As described above, the emission unit EMU of the pixel PXL including the series stages SET1 and SET2 connected in the series/parallel mixed structure may easily adjust the driving current/voltage condition according to specifications of an applied product.

For example, the emission unit EMU having the series/parallel mixed structure of FIG. 5 may reduce the driving current as compared to an emission unit having a structure in which light emitting elements LD are connected only in parallel. In addition, the emission unit EMU having the series/parallel mixed structure of FIG. 5 may reduce the driving voltage applied to both ends of the emission unit EMU compared to an emission unit having a structure in which the same number of light emitting elements LD are all connected in series. Furthermore, the emission unit EMU having the series/parallel mixed structure of FIG. 5 may include a larger number of light emitting elements LD between the same number of electrodes PE1, CTE1, CTE2, and PE2 compared to an emission unit having a structure in which series stages are all connected in series. In this case, light output efficiency of the light emitting elements LD can be improved. In addition, even if a defect occurs in a corresponding serial stage, a ratio of light emitting elements LD that do not emit light due to the defect may be relatively reduced. Accordingly, a problem in which the light output efficiency of the light emitting elements LD is lowered can be alleviated.

FIGS. 4 and 5 show one or more embodiments in which the first, second, and third transistors T1, T2, and T3 included in the pixel circuit PXC are all N-type transistors, but the present disclosure is not limited thereto. For example, at least one of the first, second, and third transistors T1, T2, and T3 may be changed to a P-type transistor.

In addition, FIGS. 4 and 5 show one or more embodiments in which the emission unit EMU is connected between the pixel circuit PXC and the second driving power source VSS, but the emission unit EMU may be connected between the first driving power source VDD and the pixel circuit PXC.

Furthermore, a configuration of the pixel circuit PXC may be modified and applied in various known forms. For example, the pixel PXL may be configured inside a passive light emitting display device or the like. In this case, the pixel circuit PXC may be omitted, and both ends of the light emitting elements LD included in the emission unit EMU may be directly connected to the scan line Si, the data line Dj, the first power source line PL1, the second power source line PL2, and/or a control line (e.g., predetermined control line).

Figure 6:
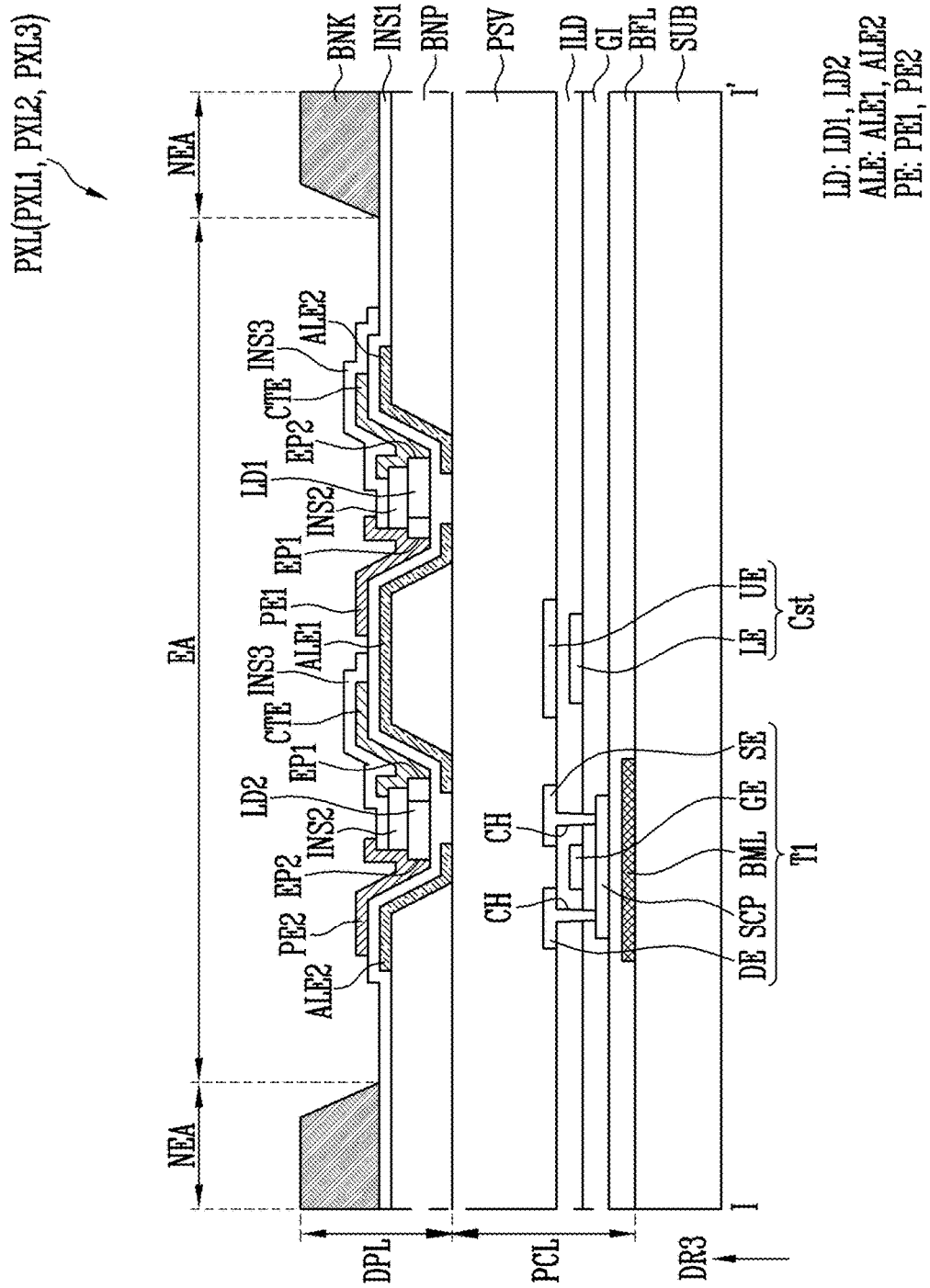
FIG. 6 is a cross-sectional view schematically illustrating an example of a stacked structure of the pixel of FIG. 5.

FIG. 6 is a cross-sectional view schematically illustrating an example of a stacked structure of the pixel of FIG. 5.

In describing embodiments, the expression "formed and/or provided on the same layer" may mean formed in the same process, and the expression "formed and/or provided on a different layer" may mean formed in different processes. In addition, in FIG. 6, a longitudinal direction (a vertical direction or a thickness direction of the substrate SUB) on the cross-section is indicated as a third direction DR3.

In FIG. 6, as an example of circuit elements that may be located in a pixel circuit layer PCL of each of the first, second, and third pixels PXL1, PXL2, and PXL3, a cross-section of one transistor (for example, the first transistor T1 including a lower metal line BML) and the storage capacitor Cst included in the pixel circuit PXC is shown as an example. Also, FIG. 6 shows, as an example, a cross-section of the emission unit EMU including the first light emitting element LD1 and the second light emitting element LD2 as an example of the emission unit EMU that may be located in a display element layer DPL of each of the first, second, and third pixels PXL1, PXL2, and PXL3.

The first pixel PXL1, the second pixel PXL2, and the third pixel PXL3 may have substantially similar cross-sectional structures to each other. However, the size, position, and/or shape of circuit elements constituting each of the first pixel PXL1, the second pixel PXL2, and the third pixel PXL3, and electrodes included in the circuit elements, may be different for each pixel PXL.

In the following embodiments, when the first pixel PXL1, the second pixel PXL2, and the third pixel PXL3 are arbitrarily referred to, they may be referred to as a pixel PXL or pixels PXL.

Referring to FIGS. 3, 5, and 6, the pixel PXL may include an emission area EA, and a non-emission area NEA adjacent to the emission area EA. The pixel PXL, and the display device DD including the same, may include the substrate SUB, the pixel circuit layer PCL, and the display element layer DPL.

In one or more embodiments, the display element layer DPL may be located on the pixel circuit layer PCL. However, this is only an example, and the pixel circuit layer PCL and the display element layer DPL might not overlap each other, and may be located on the same plane.

The substrate SUB may include a transparent insulating material to transmit light. The substrate SUB may be a rigid substrate or a flexible substrate.

The rigid substrate may be, for example, one of a glass substrate, a quartz substrate, a glass ceramic substrate, and a crystalline glass substrate.

The flexible substrate may be one of a film substrate including a polymer organic material, and a plastic substrate. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The pixel circuit layer PCL may include the pixel circuit PXC of the pixel PXL, and signal lines electrically connected to the pixel circuit PXC.

The display element layer DPL may include an alignment electrode ALE, the light emitting element LD, and a pixel electrode PE constituting the emission unit EMU of the pixel PXL.

The pixel circuit layer PCL may further include at least one insulating layer. For example, the pixel circuit layer PCL may include a buffer layer BFL, a gate insulating layer GI, an interlayer insulating layer ILD, and a passivation layer PSV sequentially stacked on the substrate SUB along the third direction DR3.

In one or more embodiments, the buffer layer BFL may be located on an entire surface of the substrate SUB. The buffer layer BFL may reduce or prevent impurities from diffusing into the pixel circuit PXC.

In one or more embodiments, the buffer layer BFL may include an inorganic insulating layer including an inorganic material. For example, the buffer layer BFL may include at least one of silicon nitride (SiNx), silicon oxide (SiOx), silicon oxynitride (SiOxNy), and a metal oxide, such as aluminum oxide (AlOx). The buffer layer BFL may be provided as a single layer, or may be provided as a multi-layer including at least a double layer. When the buffer layer BFL is provided in a multi-layer, each layer may be formed of the same material, or may be formed of different materials. The buffer layer BFL may be omitted depending on the material of the substrate SUB, process conditions, and the like.

The gate insulating layer GI may be located on an entire surface of the buffer layer BFL. The gate insulating layer GI may be an inorganic insulating layer including an inorganic material. For example, the gate insulating layer GI may include at least one of silicon nitride (SiNx), silicon oxide (SiOx), silicon oxynitride (SiOxNy), and a metal oxide, such as aluminum oxide (AlOx). However, the material of the gate insulating layer GI is not limited to the above-described embodiments. According to one or more embodiments, the gate insulating layer GI may be formed of an organic insulating layer including an organic material. The gate insulating layer GI may be provided as a single layer, or may be provided as a multi-layer including at least a double layer.

The interlayer insulating layer ILD may be provided on an entire surface of the gate insulating layer GI. The interlayer insulating layer ILD may include the same material as the gate insulating layer GI or may include one or more materials selected from materials constituting the gate insulating layer GI.

The passivation layer PSV may be located on an entire surface of the interlayer insulating layer ILD. The passivation layer PSV may be an inorganic layer (or inorganic insulating layer) including an inorganic material, or may be an organic layer (or organic insulating layer) including an organic material.

Each of the transistors of the pixel circuit PXC including the first transistor T1 (a driving transistor) may include a semiconductor pattern SCP, a gate electrode GE overlapping a portion of the semiconductor pattern SCP, and source and drain electrodes SE and DE connected to the semiconductor pattern SCP.

The semiconductor pattern SCP may be provided on the buffer layer BFL. For example, the semiconductor pattern SCP may be positioned between the buffer layer BFL and the gate insulating layer GI.

The semiconductor pattern SCP may be a semiconductor layer made of polysilicon, amorphous silicon, an oxide semiconductor, or the like. The semiconductor pattern SCP may include a channel region, a first contact region, and a second contact region. For example, the first contact region and the second contact region may include a semiconductor region doped with impurities, and the channel region may include a semiconductor region that is not doped with impurities. As the impurities, for example, n-type impurities may be used, but the present disclosure is not limited thereto.

The channel region of the semiconductor pattern SCP may overlap the gate electrode GE of the first transistor T1 and may be the channel region. The first contact region of the semiconductor pattern SCP may be connected to a source electrode SE. The second contact region of the semiconductor pattern SCP may be connected to a drain electrode DE.

The gate electrode GE may be provided and/or formed on the gate insulating layer GI. For example, the gate electrode GE may be positioned between the gate insulating layer GI and the interlayer insulating layer ILD. The gate electrode GE may overlap a portion (channel region) of the semiconductor pattern SCP.

The gate electrode GE may be formed of a single layer made of one or a mixture selected from the group consisting of molybdenum (Mo), tungsten (W), aluminum neodymium (AlNd), titanium (Ti), aluminum (Al), silver (Ag), and alloys thereof. Alternatively, the gate electrode GE may be formed in a double-layer or multi-layer structure made of a low-resistance material, such as molybdenum (Mo), titanium (Ti), copper (Cu), aluminum (Al), or silver (Ag) to reduce wiring resistance.

The source electrode SE may be located on the interlayer insulating layer ILD. The source electrode SE may be in contact with the first contact region of the semiconductor pattern SCP through a contact hole penetrating the gate insulating layer GI and the interlayer insulating layer ILD.

The drain electrode DE may be located on the interlayer insulating layer ILD, and may be spaced apart from the source electrode SE. The drain electrode DE may be in contact with the second contact region of the semiconductor pattern SCP through a contact hole penetrating the gate insulating layer GI and the interlayer insulating layer ILD.

A lower metal pattern BML may be further located under the first transistor T1.

The lower metal pattern BML may be a first conductive layer among conductive layers located on the substrate SUB. For example, the lower metal pattern BML may be a conductive layer positioned between the substrate SUB and the buffer layer BFL.

In one or more embodiments, the lower metal pattern BML may be electrically connected to the first transistor T1. In this case, a driving range of a voltage (e.g., predetermined voltage) supplied to the gate electrode GE of the first transistor T1 can be widened. In one or more embodiments, the lower metal pattern BML may be electrically connected to the semiconductor pattern SCP of the first transistor T1 to stabilize the channel region of the transistor T. In addition, as the lower metal pattern BML is electrically connected to the first transistor T1, the likelihood of floating of the lower metal pattern BML may be reduced or prevented.

In the above-described embodiments, a case in which the first transistor T1 is a thin film transistor having a top gate structure has been described as an example, but the present disclosure is not limited thereto. A structure of the transistor may be variously changed.

In one or more embodiments, the storage capacitor Cst may include a lower electrode LE and an upper electrode UE. The lower electrode LE and the upper electrode UE may overlap each other with an insulating layer interposed therebetween. As shown in FIG. 5, the storage capacitor Cst may be electrically connected between the gate electrode GE and the source electrode SE of the first transistor T1. The source electrode SE (for example, the second node N2) of the first transistor T1 may be electrically connected to the first pixel electrode PE1 of the emission unit EMU.

The lower electrode LE may be located on the gate insulating layer GI. For example, the lower electrode LE may be formed together in the process of forming the gate electrode GE, and may be electrically connected to the gate electrode GE of the first transistor T1.

The upper electrode UE may be located on the interlayer insulating layer ILD to overlap the lower electrode LE. For example, the upper electrode UE may be formed together in the process of forming the source electrode SE and the drain electrode DE. The upper electrode UE may be electrically connected to the first pixel electrode PE1.

In one or more embodiments, the pixel circuit layer PCL may include power source lines (e.g., predetermined power source lines). For example, the pixel circuit layer PCL may include the first power source line PL1 and the second power source line PL2.

The passivation layer PSV may be located on the first transistor T1 and the storage capacitor Cst. In one or more embodiments, the passivation layer PSV may be partially opened to expose the upper electrode UE. Accordingly, the upper electrode UE and the first pixel electrode PE1 may be electrically connected to each other through the opening.

The display element layer DPL may be provided on the passivation layer PSV. The display element layer DPL may include the emission unit EMU.

For example, the display element layer DPL may include first and second alignment electrodes ALE1 and ALE2, the light emitting element LD, and the first and second pixel electrodes PE1 and PE2 located in the emission area EA. In one or more embodiments, the emission unit EMU may include the plurality of light emitting elements LD.

In addition, the display element layer DPL may further include insulating patterns and/or insulating layers sequentially located on one surface of the pixel circuit layer PCL. For example, the display element layer DPL may further include a bank pattern BNP, a first insulating layer INS1, a bank BNK, a second insulating layer INS2, and a third insulating layer INS3.

The bank pattern BNP (also referred to as a support member or wall pattern) may be provided on the passivation layer PSV. In one or more embodiments, the bank pattern BNP may be formed as a separate pattern individually located under the first and second alignment electrodes ALE1 and ALE2 to overlap a portion of each of the first and second alignment electrodes ALE1 and ALE2. Alternatively, the bank pattern BNP may have/define an opening or a recess corresponding to an area between the first and second alignment electrodes ALE1 and ALE2 in the emission area EA, and may be formed as an integral pattern connected as a whole in the display area DA.

Accordingly, the light emitting elements LD may be located to overlap the passivation layer PSV exposed from the bank pattern BNP. In other words, the light emitting elements LD may be located in the opening or the recess formed by the bank pattern BNP. For example, the light emitting elements LD might not overlap the bank pattern BNP in the third direction DR3.

The bank pattern BNP may be an inorganic layer including an inorganic material or an organic layer including an organic material. According to one or more embodiments, the bank pattern BNP may include a single-layered organic layer and/or a single-layered inorganic layer, but the present disclosure is not limited thereto. According to one or more embodiments, bank patterns BNP may be provided in the form of a multi-layer in which at least one organic layer and at least one inorganic layer are stacked. However, the material of the bank pattern BNP is not limited to the above-described embodiments. According to one or more embodiments, the bank pattern BNP may include a conductive material. The shape of the bank pattern BNP may be variously changed within a range capable of improving the efficiency of light emitted from the light emitting element LD.

The bank pattern BNP may be used as a reflective member. As an example, the bank pattern BNP, together with the first and second alignment electrodes ALE1 and ALE2 located thereon, may guide the light emitted from the light emitting element LD in a desired direction to improve light output efficiency of the pixel PXL.

The first and second alignment electrodes ALE1 and ALE2 may be provided on the bank pattern BNP. The first alignment electrode ALE1 and the second alignment electrode ALE2 may be located to be spaced apart from each other. The first alignment electrode ALE1 and the second alignment electrode ALE2 may be located on the same plane, and may have the same thickness in the third direction DR3. The first alignment electrode ALE1 and the second alignment electrode ALE2 may be concurrently or substantially simultaneously formed in the same process.

Each of the first alignment electrode ALE1 and the second alignment electrode ALE2 may have a shape corresponding to the profile of the bank pattern BNP located thereunder.

The first alignment electrode ALE1 and the second alignment electrode ALE2 may be formed of a material having a constant (or uniform) reflectance so that light emitted from the light emitting element LD travels in an image display direction of the display device DD. For example, the first alignment electrode ALE1 and the second alignment electrode ALE2 may include an opaque metal. The opaque metal may include a metal, such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof.

However, the material of the first alignment electrode ALE1 and the second alignment electrode ALE2 are not limited thereto. The first alignment electrode ALE1 and the second alignment electrode ALE2 may include a transparent conductive material. The transparent conductive material may include a conductive oxide, such as indium tin oxide (ITO), indium zinc oxide (IZO), zinc oxide (ZnOx), indium gallium zinc oxide (IGZO), and indium tin zinc oxide (ITZO) or a conductive polymer, such as poly(3,4-ethylenedioxythiophene) (PEDOT).

The first alignment electrode ALE1 and the second alignment electrode ALE2 may be provided as a single layer, but the present disclosure is not limited thereto. According to one or more embodiments, the first alignment electrode ALE1 and the second alignment electrode ALE2 may be provided as a multi-layer in which at least two or more of metals, alloys, conductive oxides, and conductive polymers are stacked.

In one or more embodiments, at least one first alignment electrode ALE1 and at least one second alignment electrode ALE2 may be located in the emission area EA. For example, one first alignment electrode ALE1 may be located in the center of the emission area EA, and two second alignment electrodes ALE2 may be located on both sides of the first alignment electrode ALE1. The two second alignment electrodes ALE2 may be connected to each other to receive the same signal or power source. The number, shape, size, and/or position of each of the first and second alignment electrodes ALE1 and ALE2 located in the emission area EA may be variously changed according to embodiments.

The first insulating layer INS1 may be located on the first and second alignment electrodes ALE1 and ALE2.

In one or more embodiments, the first insulating layer INS1 may be provided on the first and second alignment electrodes ALE1 and ALE2 and the bank pattern BNP. The first insulating layer INS1 may be partially opened to expose the components positioned thereunder in the non-emission area NEA of the pixel PXL. For example, the first insulating layer INS1 may be partially opened to include one or more contact holes for connecting the first and second alignment electrodes ALE1 and ALE2 to the first and second pixel electrodes PE1 and PE2, respectively, in the non-emission area NEA. These contact holes may expose the first and second alignment electrodes ALE1 and ALE2.

The first insulating layer INS1 may be formed of an inorganic insulating layer including an inorganic material. For example, the first insulating layer INS1 may be formed of an inorganic insulating layer suitable for protecting the light emitting elements LD from the pixel circuit layer PCL. For example, the first insulating layer INS1 may include at least one of silicon nitride (SiNx), silicon oxide (SiOx), silicon oxynitride (SiOxNy), and a metal oxide, such as aluminum oxide (AlOx).

According to one or more embodiments, the first insulating layer INS1 may be provided as a single layer or a multi-layer. When the first insulating layer INS1 is provided as a multi-layer, the first insulating layer INS1 may be provided as a distributed Bragg reflector (DBR) structure in which first and second layers, which are made of an inorganic layer and have different refractive indices, are alternately stacked.

In one or more embodiments, the first insulating layer INS1 may be provided in a pattern shape (e.g., predetermined pattern shape). For example, the first insulating layer INS1 may cover only a portion of an upper surface of the bank pattern BNP. Accordingly, outgassing from the bank pattern BNP, the first insulating layer INS1, and the like may be smoothly performed.

The bank BNK (or a first bank) may be located on the first insulating layer INS1.

The bank BNK may be provided on the first insulating layer INS1 in the non-emission area NEA of each of the pixels PXL. The bank BNK may surround the emission area EA of each of the pixels PXL. For example, the bank BNK may be understood as a pixel-defining layer that partitions the emission area EA of each of the pixels PXL.

In an operation of supplying (or inputting) the light emitting elements LD to the emission area EA, the bank BNK may constitute a dam structure that reduces or prevents the likelihood of a solution (or ink) containing the light emitting elements LD following into the emission area EA of an adjacent pixel PXL, or that controls the solution to be supplied in an appropriate amount to each emission area EA.

The bank BNK may include at least one light-blocking material and/or reflective material (or scattering material), and may reduce or prevent light leakage defects between the pixels PXL.

According to one or more embodiments, the bank BNK may include a transparent material. For example, the transparent material may include a polyamides resin, a polyimides resin, and the like, but the present disclosure is not limited thereto. According to one or more other embodiments, a reflective material layer may be separately provided and/or formed on the bank BNK to further improve the efficiency of the light emitted from the pixel PXL.

In one or more embodiments, the bank BNK may be surface treated so that at least one surface of the bank BNK is hydrophobic. For example, the bank BNK may be surface treated to have hydrophobicity by plasma before the light emitting elements LD are aligned, but the present disclosure is not limited thereto.

The light emitting elements LD may be supplied to the emission area EA of the pixel PXL surrounded (or defined) by the bank BNK. For example, the light emitting elements LD may be supplied (or inputted) to the emission area EA by an inkjet printing method or the like, and the light emitting elements LD may be aligned on a surface of the first insulating layer INS1 between the first alignment electrode ALE1 and the second alignment electrode ALE2 by an electric field formed by a signal (e.g., predetermined signal, or an alignment signal) applied to both the first alignment electrode ALE1 (or a first alignment line before being separated into the first alignment electrode ALE1) and the second alignment electrode ALE2 (or a second alignment line before being separated into the second alignment electrode ALE2). For example, the light emitting elements LD supplied to the emission area EA may be arranged such that first ends EP1 face the first alignment electrode ALE1, and such that second ends EP2 face the second alignment electrode ALE2.

The light emitting element LD may include the first light emitting element LD1 and the second light emitting element LD2.

The first light emitting element LD1 may include a first end EP1 facing one side of the first alignment electrode ALE1, and a second end EP2 facing the second alignment electrode ALE2 adjacent to the one side of the first alignment electrode ALE1.

The second light emitting element LD2 may include a first end EP1 facing the other side of the first alignment electrode ALE1, and a second end EP2 facing another second alignment electrode ALE2 adjacent to the other side of the first alignment electrode ALE1.

The second insulating layer INS2 (or an insulating pattern) may be provided on the first and second light emitting elements LD1 and LD2. The second insulating layer INS2 may be positioned on the first and second light emitting elements LD1 and LD2 to partially cover the outer peripheral surface (or surface) of each of the first and second light emitting elements LD1 and LD2, so that the first and second ends EP1 and EL2 of each of the first and second light emitting elements LD1 and LD2 may be exposed to outside.

The second insulating layer INS2 may include an inorganic insulating layer including an inorganic material, or an organic insulating layer. For example, the second insulating layer INS2 may protect the first and second light emitting elements LD1 and LD2 from external oxygen and moisture. The second insulating layer INS2 may be formed of a single layer or a multi-layer.

Because the second insulating layer INS2 is formed on the aligned first and second light emitting elements LD1 and LD2, it is possible to reduce or prevent the likelihood of the first and second light emitting elements LD1 and LD2 being separated from the aligned positions.

In one or more embodiments, the second insulating layer INS2 may be partially located on the bank BNK. For example, the second insulating layer INS2 may be located as a pattern (e.g., predetermined pattern) on the bank BNK. Accordingly, outgassing onto the bank BNK can be suitably performed.

The first pixel electrode PE1, the second pixel electrode PE2, and the intermediate electrode CTE may be located to be electrically connected to respective ends (that is, the first and second ends EP1 and EP2) of the first and second light emitting elements LD1 and LD2 that are not covered by the second insulating layer INS2. For example, the first pixel electrode PE1 may be located on the first end EP1 of the first light emitting element LD1 (or in contact with the first end EP1), and the intermediate electrode CTE may be located on the second end EP2 of the first light emitting element LD1 (or in contact with the second end EP2).

The intermediate electrode CTE may be located on the first end EP1 of the second light emitting element LD2 (or in contact with the first end EP1), and the second pixel electrode PE2 may be located on the second end EP2 of the second light emitting element LD2 (or in contact with the second end EP2).

In FIG. 6, the intermediate electrode CTE contacting the second end EP2 of the first light emitting element LD1, and the intermediate electrode CTE contacting the first end EP1 of the second light emitting element LD2, are shown as being separated from each other, but the intermediate electrodes CTE may be one intermediate electrode CTE connected to each other.

In addition, in FIG. 6, the first alignment electrode ALE1 and the first pixel electrode PE1 are shown as being electrically separated (or not connected), but the first alignment electrode ALE1 and the first pixel electrode PE1 may be electrically connected to each other through at least one contact hole in an area. Similarly, the second alignment electrode ALE2 and the second pixel electrode PE2 may be electrically connected to each other through at least one contact hole in an area.

The intermediate electrode CTE may overlap a portion of each of the first alignment electrode ALE1 and the second alignment electrode ALE2, and may be located on the first insulating layer INS1 and the second insulating layer INS2.

The third insulating layer INS3 may be provided on the second insulating layer INS2 and the intermediate electrode CTE. The third insulating layer INS3 may include/define an opening exposing a portion of the first insulating layer INS1. Also, in one or more embodiments, the third insulating layer INS3 may be located on at least a portion of the bank BNK.

The third insulating layer INS3 may cover the intermediate electrode CTE to reduce or prevent corrosion of the intermediate electrode CTE. The third insulating layer INS3 may include an inorganic insulating layer made of an inorganic material, or an organic insulating layer made of an organic material. For example, the third insulating layer INS3 may include at least one of silicon nitride (SiNx), silicon oxide (SiOx), silicon oxynitride (SiOxNy), and a metal oxide, such as aluminum oxide (AlOx), but the present disclosure is not limited thereto. Also, the third insulating layer INS3 may be formed as a single layer or a multi-layer.

The first pixel electrode PE1 and the second pixel electrode PE2 may be formed on a different layer from the intermediate electrode CTE. Also, the first pixel electrode PE1 and the second pixel electrode PE2 may be formed on the same layer in the same process.

The first pixel electrode PE1 may overlap a portion of the first alignment electrode ALE1 and may be located on the first insulating layer INS1, on the second insulating layer INS2, and on the third insulating layer INS3. The second pixel electrode PE2 may overlap a portion of the second alignment electrode ALE2, and may be located on the first insulating layer INS1, on the second insulating layer INS2, and on the third insulating layer INS3.

Figure 7:
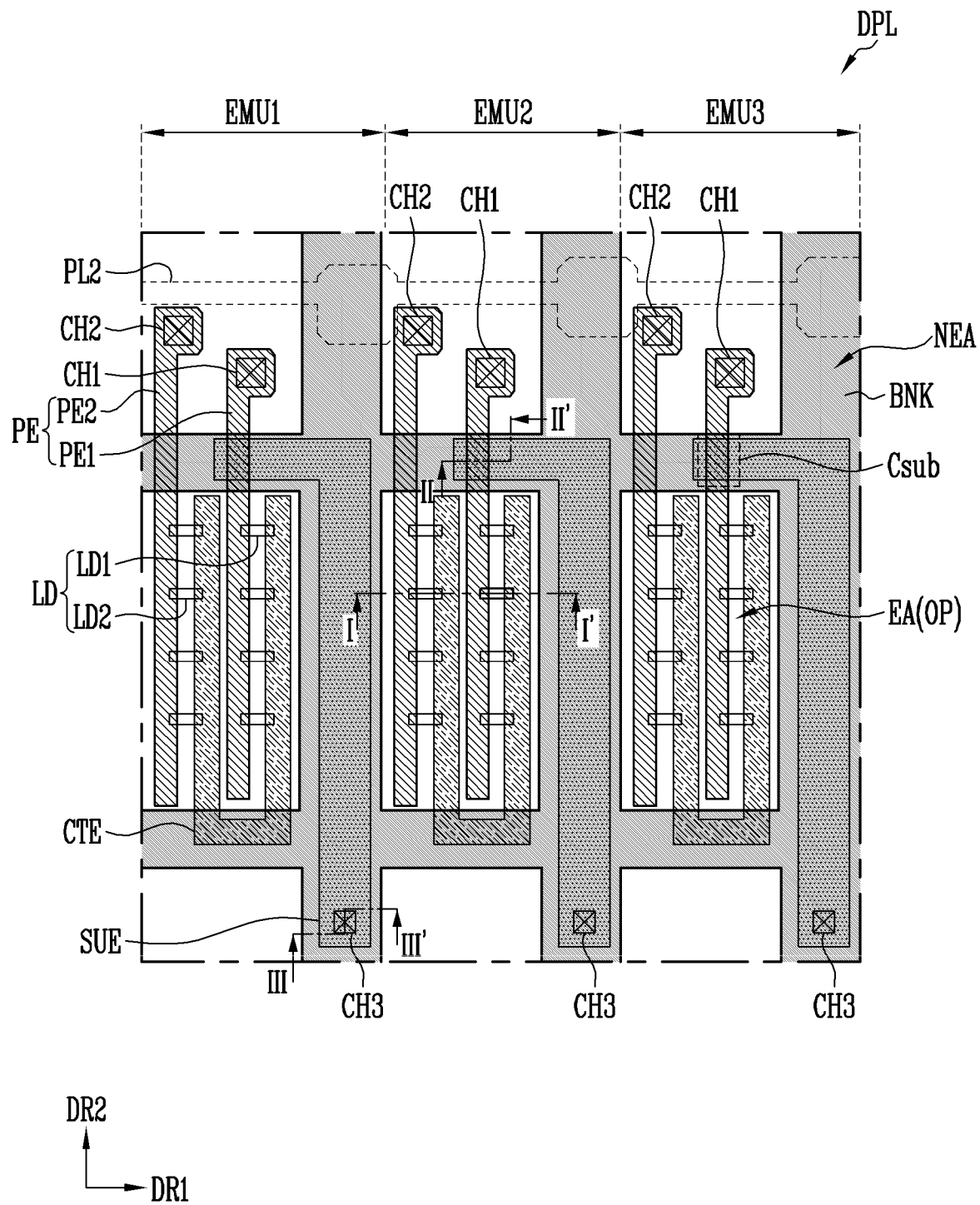
FIGS. 7 and 8 are plan views schematically illustrating an example of a display element layer of the pixel of FIG. 5.

In one or more embodiments, the first pixel electrode PE1 and the second pixel electrode PE2 may include portions extending over the bank layer BNK (refer to FIG. 7 and the like).

The first pixel electrode PE1, the second pixel electrode PE2, and the intermediate electrode CTE may be formed of various transparent conductive materials so that light emitted from each of the light emitting elements LD travels in the image display direction (for example, the third direction DR3) of the display device DD without loss. For example, the first pixel electrode PE1, the second pixel electrode PE2, and the intermediate electrode CTE may include at least one of various transparent conductive materials, such as indium tin oxide (ITO), indium zinc oxide (IZO), zinc oxide (ZnOx), indium gallium zinc oxide (IGZO), and indium tin zinc oxide (ITZO), and may be configured to be substantially transparent or translucent to satisfy a light transmittance (e.g., predetermined light transmittance). However, materials of the first pixel electrode PE1, the second pixel electrode PE2, and the intermediate electrode CTE are not limited to the above-described embodiments. According to some embodiments, the first pixel electrode PE1, the second pixel electrode PE2, and the intermediate electrode CTE may be formed of various opaque conductive materials. The first pixel electrode PE1, the second pixel electrode PE2, and the intermediate electrode CTE may be formed of a single layer or a multi-layer.

Meanwhile, in one or more embodiments, a sub-electrode for forming the sub-capacitor Csub may be further formed on the bank BNK.

Figure 8:
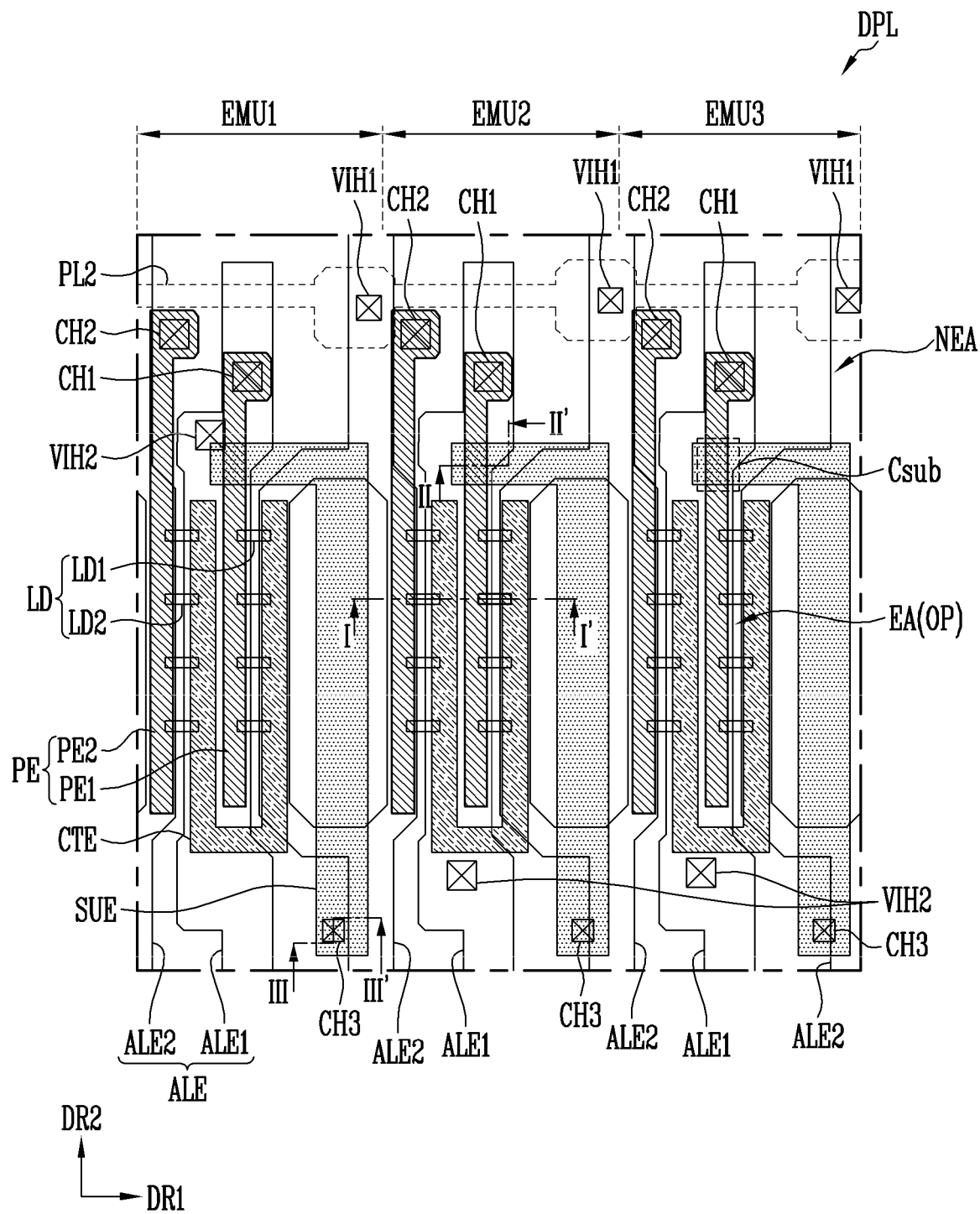

FIGS. 7 and 8 are plan views schematically illustrating an example of a display element layer of the pixel of FIG. 5.

In FIGS. 7 and 8, to clearly distinguish the components and to facilitate explanation, some components may have been omitted from the same area. For example, the alignment electrode ALE is omitted in FIG. 7, and the bank BNK is omitted in FIG. 8.

Referring to FIGS. 5, 6, 7, and 8, the display element layer DPL of the pixel PXL may include an alignment electrode ALE, a light emitting element LD, a pixel electrode PE, and a sub-electrode SUE. In addition, the display element layer DPL may further include a bank BNK located in the non-emission area NEA.

In one or more embodiments, the display element layer DPL may include a first emission unit EMU1 included in a first pixel PXL1, a second emission unit EMU2 included in a second pixel PXL2, and a third emission unit EMU3 included in a third pixel PXL3. Each of the first emission unit EMU1, the second emission unit EMU2, and the third emission unit EMU3 may include light emitting elements LD and electrodes (for example, the alignment electrode ALE, the pixel electrode PE, and the sub-electrode SUE) electrically connected to the light emitting elements LD.

In one or more embodiments, the first to third emission units EMU1, EMU2, and EMU3 may be arranged in the first direction DR1. However, this is only an example, and the arrangement of the first to third emission units EMU1, EMU2, and EMU3 is not limited thereto.

Meanwhile, because the configuration and structure of the first to third emission units EMU1, EMU2, and EMU3 may be substantially the same or similar to each other, the display element layer DPL will be described with reference to one emission unit.

The bank BNK may be a structure defining (or partitioning) the emission area EA, and may be a pixel-defining layer. For example, an opening OP of the bank BNK may define the emission area EA of the pixel PXL.

In one or more embodiments, components may be provided in the order of the alignment electrode ALE, the light emitting element LD, the sub-electrode Csub, and pixel electrodes PE based on one surface of the substrate SUB.

As shown in FIG. 8, the alignment electrode ALE may include a first alignment electrode ALE1 and a second alignment electrode ALE2 arranged to be spaced apart from each other in the first direction DR1. The first alignment electrode ALE1 and the second alignment electrode ALE2 may be alternately arranged in the first direction DR1.

In one or more embodiments, first alignment electrodes ALE1 corresponding to the different emission units EMU1, EMU2, and EMU3 may have shapes separated from each other. In addition, second alignment electrodes ALE2 corresponding to the different emission units EMU1, EMU2, and EMU3 may have shapes separated from each other.

Each of the first alignment electrode ALE1 and the second alignment electrode ALE2 may extend in the second direction DR2. In one or more embodiments, the first alignment electrodes ALE1 corresponding to adjacent pixel rows (for example, pixel rows adjacent to each other in the second direction DR2) may be separated from each other. Accordingly, the first alignment electrodes ALE1 of the pixels PXL positioned in the same pixel column may be electrically separated from each other, and the corresponding pixels PXL may be individually driven.

Each of the second alignment electrode ALE2, the first alignment electrode ALE1, and another second alignment electrode ALE2 may be used as an alignment line for aligning the light emitting elements LD by receiving a signal (e.g., predetermined signal, for example, an alignment signal) before the light emitting elements LD are aligned in an emission area EMA of a first sub-pixel SPXL1.

The first alignment electrode ALE1 may receive a first alignment signal in the operation of aligning the light emitting elements LD, and the second alignment electrode ALE2 may receive a second alignment signal in the operation of aligning the light emitting elements LD. The first and second alignment signals may be signals having a voltage difference and/or a phase difference sufficient to align the light emitting elements LD between the alignment electrodes ALE. At least one of the first and second alignment signals may be an AC signal, but the present disclosure is not limited thereto.

In one or more embodiments, the first alignment signal supplied to the first alignment electrode ALE1 may be an AC signal, and the second alignment signal supplied to the second alignment electrode ALE2 may be a ground voltage.

The first alignment electrode ALE1 and the second alignment electrode ALE2 may be provided in a bar shape, but the present disclosure is not limited thereto. The first alignment electrode ALE1 and the second alignment electrode ALE2 may have curved portions at one or more positions (e.g., predetermined positions).

To change the surface profile (or shape) of the alignment electrode ALE so that the light emitted from the light emitting elements LD can be guided in the image display direction of the display device DD, the bank pattern BNP (refer to FIG. 6) may be positioned below the above-described alignment electrode ALE. The bank pattern BNP may be a support member for supporting the alignment electrode ALE.

In one or more embodiments, the first alignment electrode ALE1 may be electrically connected to an electrode (for example, the source electrode SE) of the first transistor T1 through a contact hole in one or more embodiments.

In one or more embodiments, the second alignment electrode ALE2 may be electrically connected to the second power source line PL2 located in the pixel circuit layer PCL through a via hole VIH1. The via hole VIH1 may be formed to pass through the passivation layer PSV or the like. Accordingly, the voltage of the second driving power source VSS supplied to the second power source line PL2 may be supplied to the second alignment electrode ALE2 and the second pixel electrode PE2 connected thereto.

In one or more embodiments, the first insulating layer INS1 may be located on the alignment electrode ALE (refer to FIG. 6).

At least two to dozens, several tens, or scores of light emitting elements LD may be aligned in the emission area EA. When viewed on a plane, the light emitting elements LD may be located between the first alignment electrode ALE1 and the second alignment electrode ALE2 that are adjacent (opposite) to each other. Each of the light emitting elements LD may include a first end EP1 (or one end) and a second end EP2 (or the other end) positioned at both ends in a longitudinal direction thereof.

In one or more embodiments, a p-type semiconductor layer may be positioned at the first end EP1, and an n-type semiconductor layer may be positioned at the second end EP2.

In one or more embodiments, the light emitting elements LD may include a first light emitting element LD1 and a second light emitting element LD2.

The first light emitting element LD1 may be aligned between one side of the first alignment electrode ALE1 and the second alignment electrode ALE2 (e.g., a portion of the second alignment electrode ALE2) that is adjacent thereto, and may be electrically connected to the first pixel electrode PE1 and the intermediate electrode CTE. The second light emitting element LD2 may be aligned between the other side of the first alignment electrode ALE1 and the second alignment electrode ALE2 (e.g., the other portion of the second alignment electrode ALE2) that is adjacent thereto, and may be electrically connected to the intermediate electrode CTE and the second pixel electrode PE2.

Each of the first light emitting element LD1 and the second light emitting element LD2 may be provided in plurality. The first end EP1 of each of the first light emitting elements LD1 may be electrically connected to the first pixel electrode PE1, and the second end EP2 of each of the first light emitting elements LD1 may be electrically connected to the intermediate electrode CTE.

The first end EP1 of each of the second light emitting elements LD2 may be electrically connected to the intermediate electrode CTE, and the second end EP2 of each of the second light emitting elements LD2 may be electrically connected to the second pixel electrode PE2.

For example, the first light emitting elements LD1 may be connected in parallel between the first pixel electrode PE1 and the intermediate electrode CTE to form a first series stage SET1, and the second light emitting elements LD2 may be connected in parallel between the intermediate electrode CTE and the second pixel electrode PE2 to form a second series stage SET2.

According to one or more embodiments, the first light emitting element LD1 and the second light emitting element LD2 may be ultra-small light emitting diodes using a material having an inorganic crystal structure and having a size as small as, for example, a nanoscale (or nanometer) to a microscale (or micrometer). For example, the first light emitting element LD1 and the second light emitting element LD2 may be the light emitting elements LD described with reference to FIGS. 1 and 2.

In one or more embodiments, as shown in FIG. 7, the sub-electrode SUE may be located on the bank BNK. In other words, the sub-electrode SUE may be located in the non-emission area NEA. In one or more embodiments, the sub-electrode SUE may be directly located on the upper surface of the bank BNK.

The sub-electrode SUE may be electrically connected to the lower electrode LE of the storage capacitor Cst and to the gate electrode of the first transistor T1 through a third contact hole CH3. The third contact hole CH3 may be formed to pass through the bank BNK. Accordingly, the sub-electrode SUE may constitute an electrode of the sub-capacitor Csub.

The sub-electrode SUE may be located on the bank BNK to overlap the first pixel electrode PE1. Accordingly, a portion where the sub-electrode SUE and the first pixel electrode PE1 overlap may constitute the sub-capacitor Csub.

In one or more embodiments, as shown in FIG. 7, the sub-electrode SUE may have at least one curved portion, and may extend lengthwise in the second direction DR2 past the emission area EA. Accordingly, the third contact hole CH3 may be formed at a position farthest from the emission area EA. Accordingly, a process defect caused by the formation of the sub-electrode SUE and/or electrical interference caused by the sub-electrode SUE when the pixel PXL is driven may be reduced or minimized.

The pixel electrode PE and the intermediate electrode CTE may be provided to correspond to the alignment electrode ALE and the light emitting elements LD. For example, the pixel electrode PE and the intermediate electrode CTE may be formed to overlap the alignment electrode ALE and the corresponding light emitting elements LD, respectively.

The pixel electrode PE may include a first pixel electrode PE1 and a second pixel electrode PE2. The first pixel electrode PE1, the second pixel electrode PE2, and the intermediate electrode CTE may be located to be spaced apart from each other.

In one or more embodiments, the first pixel electrode PE1 and the second pixel electrode PE2 may be provided on the same layer in the same process.

The first pixel electrode PE1 may be formed on one side of the first alignment electrode ALE1 and on the first end EP1 of each of the first light emitting elements LD1, and may be electrically connected to the first end EP1 of each of the first light emitting elements LD1. In one or more embodiments, the first pixel electrode PE1 may have a bar shape extending along the second direction DR2. The first pixel electrode PE1 may include a portion overlapping the bank BNK.

The first pixel electrode PE1 may be electrically connected to the first alignment electrode ALE1 through a first contact hole CH1. The first contact hole CH1 may be formed in the first insulating layer INS1 between the first pixel electrode PE1 and the first alignment electrode ALE1. Accordingly, the first pixel electrode PE1 may be electrically connected to an electrode (for example, the source electrode SE) of the first transistor T1.

In one or more embodiments, a portion of the first pixel electrode PE1 located on the bank BNK may overlap the sub-electrode Csub with the third insulating layer INS3 interposed therebetween. This portion may constitute the sub-capacitor Csub. Also, the sub-capacitor Csub may be electrically connected in parallel with the storage capacitor Cst.

The second pixel electrode PE2 may be formed on the second alignment electrode ALE2 and the second end EP2 of each of the second light emitting elements LD2, and may be electrically connected to the second end EP2 of each of the second light emitting elements LD2. The second pixel electrode PE2 may have a bar shape extending along the second direction DR2. Also, the second pixel electrode PE2 may have a portion overlapping the bank BNK. The second pixel electrode PE2 might not overlap the sub-electrode SUE.

The second pixel electrode PE2 may be electrically connected to the second alignment electrode ALE2 through a second contact hole CH2. The second contact hole CH2 may be formed in the first insulating layer INS1 between the second pixel electrode PE2 and the second alignment electrode ALE2. As the second pixel electrode PE2 is electrically connected to the second alignment electrode ALE2, the second pixel electrode PE2 may be electrically connected to the second power source line PL2. Accordingly, the voltage of the second driving power source VSS may be provided to the second pixel electrode PE2.

In one or more embodiments, the first pixel electrode PE1 and the second pixel electrode PE2 may be alternately arranged in the first direction DR1.

The intermediate electrode CTE may be located to overlap a portion of the first alignment electrode ALE1 and a portion of the second alignment electrode ALE2. The intermediate electrode CTE may be electrically connected to the second end EP2 of each of the first light emitting elements LD1, and may be electrically connected to the first end EP1 of each of the second light emitting elements LD2.

In one or more embodiments, when viewed on a plane, the intermediate electrode CTE may include a portion positioned between the first pixel electrode PE1 and the second pixel electrode PE2, and may surround a portion of the first pixel electrode PE1. The intermediate electrode CTE may have a shape bent at least once. For example, when viewed on a plane, the intermediate electrode CTE may have a "U" shape.

The first light emitting elements LD1 may be connected in series to the second light emitting elements LD2 through the intermediate electrode CTE. In one or more embodiments, the first pixel electrode PE1 may be an anode of the first emission unit EMU1, and the second pixel electrode PE2 may be a cathode of the first emission unit EMU1.

In one or more embodiments, the intermediate electrode CTE may be located on a different layer by a process different from that of the pixel electrode PE. For example, the third insulating layer INS3 (refer to FIG. 6) may be located on the intermediate electrode CTE, and the pixel electrode PE may be located on a portion of the third insulating layer INS3.

As described above, the pixel PXL according to the embodiments of the present disclosure, and the display device DD including the same, may include the sub-electrode SUE and the first pixel electrode PE1 overlapping each other with the third insulating layer INS3 interposed therebetween on the bank BNK of the non-emission area NEA. A portion where the sub-electrode SUE and the first pixel electrode PE1 overlap each other may form the sub-capacitor Csub connected in parallel with the storage capacitor Cst, and may increase the equivalent capacitance for charging the data voltage. Accordingly, in a high-resolution display device DD having a high pixel density, a charging rate of the data voltage may be improved, and the SRU between neighboring pixels may be improved.

Figure 9:
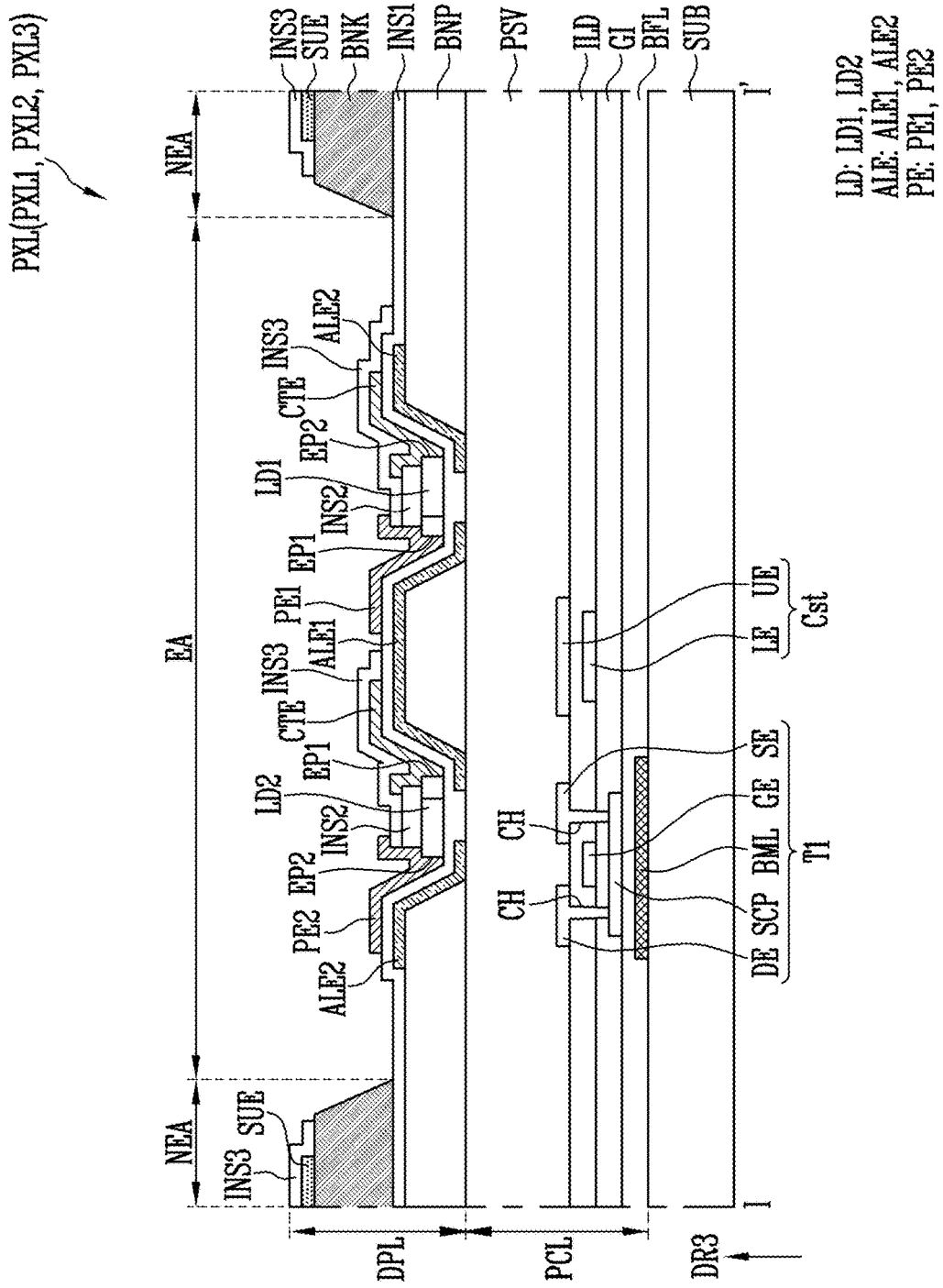
FIG. 9 is a cross-sectional view schematically illustrating an example of a cross-section taken along the line I-I' of FIGS. 7 and 8.
Figure 10:
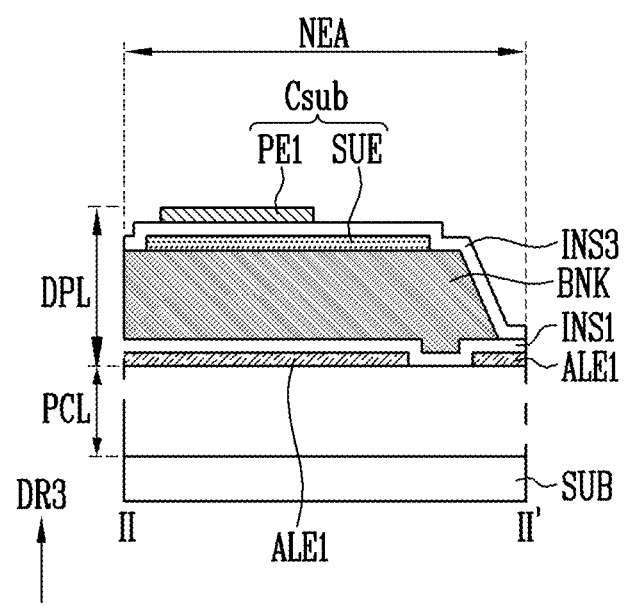
FIG. 10 is a cross-sectional view schematically illustrating an example of a cross-section taken along the line II-II' of FIGS. 7 and 8.

FIG. 9 is a cross-sectional view schematically illustrating an example of a cross-section taken along the line I-I' of FIGS. 7 and 8. FIG. 10 is a cross-sectional view schematically illustrating an example of a cross-section taken along the line II-II' of FIGS. 7 and 8.

The cross-sectional views of FIGS. 9 and 10 may be substantially the same as, or similar to, the stacked structure of the pixel PXL described with reference to FIG. 6 except for the structure on the bank BNK. Therefore, a description of overlapping contents will be omitted.

Referring to FIGS. 5, 7, 8, 9, and 10, the sub-electrode SUE, the third insulating layer INS3, and the first pixel electrode PE1 may be sequentially located on the bank BNK of the non-emission area NEA.

In one or more embodiments, as shown in FIG. 10, the first alignment electrode ALE1 may extend below the bank BNK. The first insulating layer INS1 may be located between the bank BNK and the first alignment electrode ALE1.

The sub-electrode SUE may be located on the bank BNK. The sub-electrode SUE may include an opaque conductive material. For example, the sub-electrode SUE may be formed of a single layer made of one of, or a mixture selected from the group consisting of, molybdenum (Mo), tungsten (W), aluminum neodymium (AlNd), titanium (Ti), aluminum (Al), silver (Ag), and alloys thereof. Alternatively, the sub-electrode SUE may be formed in a double-layer or multi-layer structure made of a low-resistance material, such as molybdenum (Mo), titanium (Ti), copper (Cu), aluminum (Al), or silver (Ag) to reduce wiring resistance.

However, this is only an example, and the sub-electrode SUE may include at least one of various transparent conductive materials, such as indium tin oxide (ITO), indium zinc oxide (IZO), zinc oxide (ZnOx), indium gallium zinc oxide (IGZO), and indium tin zinc oxide (ITZO).

The third insulating layer INS3 may cover the sub-electrode SUE on the bank BNK while covering a common electrode CTE. For example, as shown in FIG. 9, the third insulating layer INS3 may be formed to include/define openings exposing the first insulating layer INS1 and/or the bank BNK.

In one or more embodiments, as shown in FIG. 10, the third insulating layer INS3 may cover the side surface of the bank BNK. However, this is only an example, and a portion on which the third insulating layer INS3 is located may be variously changed according to process conditions and the like.

The first pixel electrode PE1 and the second pixel electrode PE2 may be located on the third insulating layer INS3. The first pixel electrode PE1 may overlap the first alignment electrode ALE1, and the second pixel electrode PE2 may overlap the second alignment electrode ALE2. Also, the first pixel electrode PE1 and the second pixel electrode PE2 may include portions extending over the bank BNK.

In one or more embodiments, the first pixel electrode PE1 may overlap the sub-electrode SUE on the bank BNK. Accordingly, the first pixel electrode PE1 and the sub-electrode SUE may face each other with the third insulating layer INS3 interposed therebetween. A portion where the first pixel electrode PE1 and the sub-electrode SUE overlap may form the sub-capacitor Csub.

As described above, the sub-capacitor Csub may be electrically connected in parallel with the storage capacitor Cst.

Figure 11:
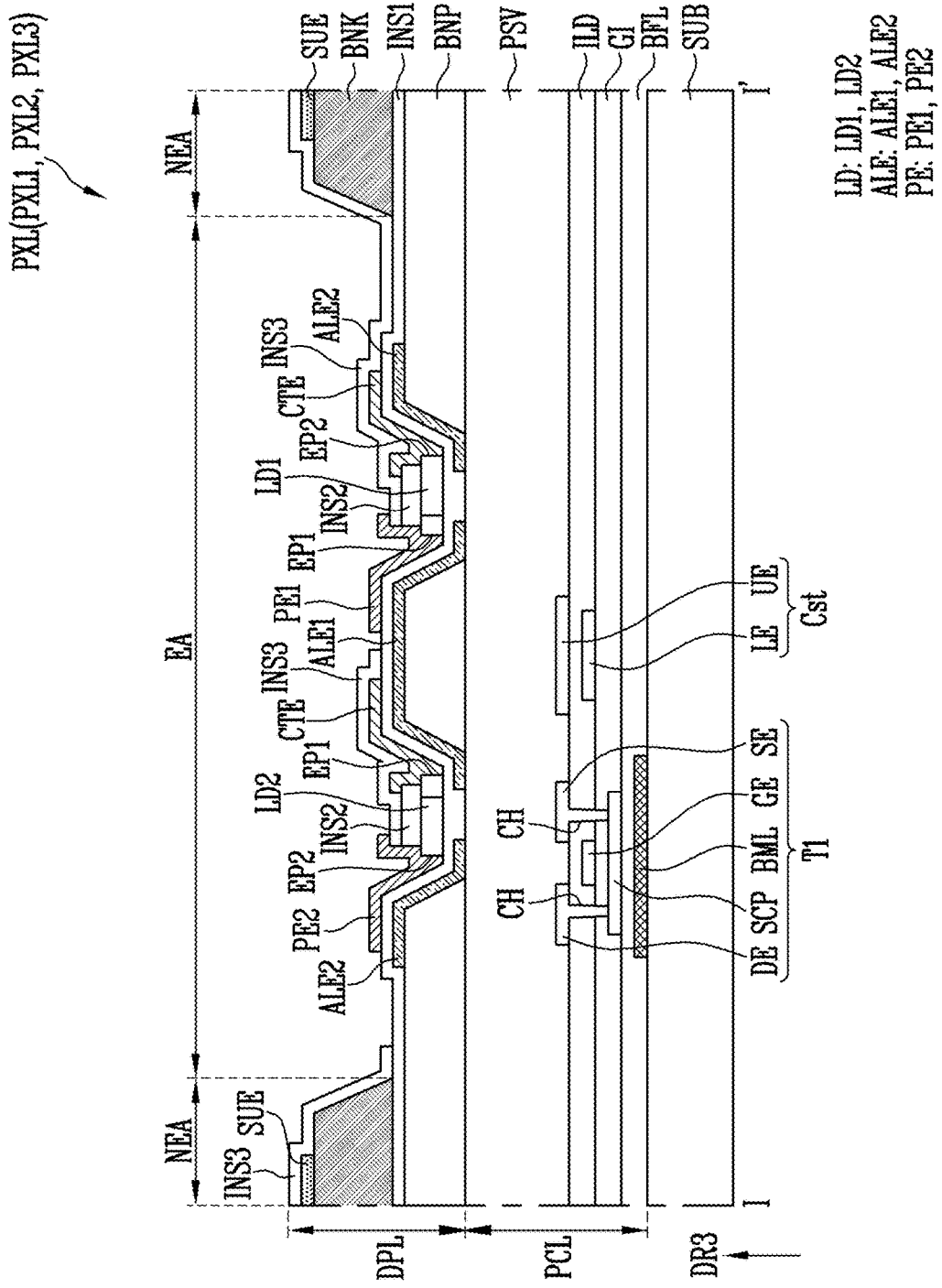
FIG. 11 is a cross-sectional view schematically illustrating another example of the cross-section taken along the line I-I' of FIGS. 7 and 8.

FIG. 11 is a cross-sectional view schematically illustrating another example of the cross-section taken along the line I-I' of FIGS. 7 and 8.

The cross-sectional view of FIG. 11 may be substantially the same as, or similar to, the stacked structure of FIG. 9 except for the portion where the third insulating layer INS3 extends. Therefore, a description of overlapping contents will be omitted.

Referring to FIGS. 5, 7, 8, 10, and 11, the sub-electrode SUE, the third insulating layer INS3, and the first pixel electrode PE1 may be sequentially located on the bank BNK of the non-emission area NEA.

In one or more embodiments, the third insulating layer INS3 may extend integrally over the bank BNK adjacent to the common electrode CTE on the common electrode CTE. Also, the third insulating layer INS3 may be located to cover at least one side surface of the bank BNK. Accordingly, a short circuit defect between conductive patterns of different layers may be reduced.

Figure 12:
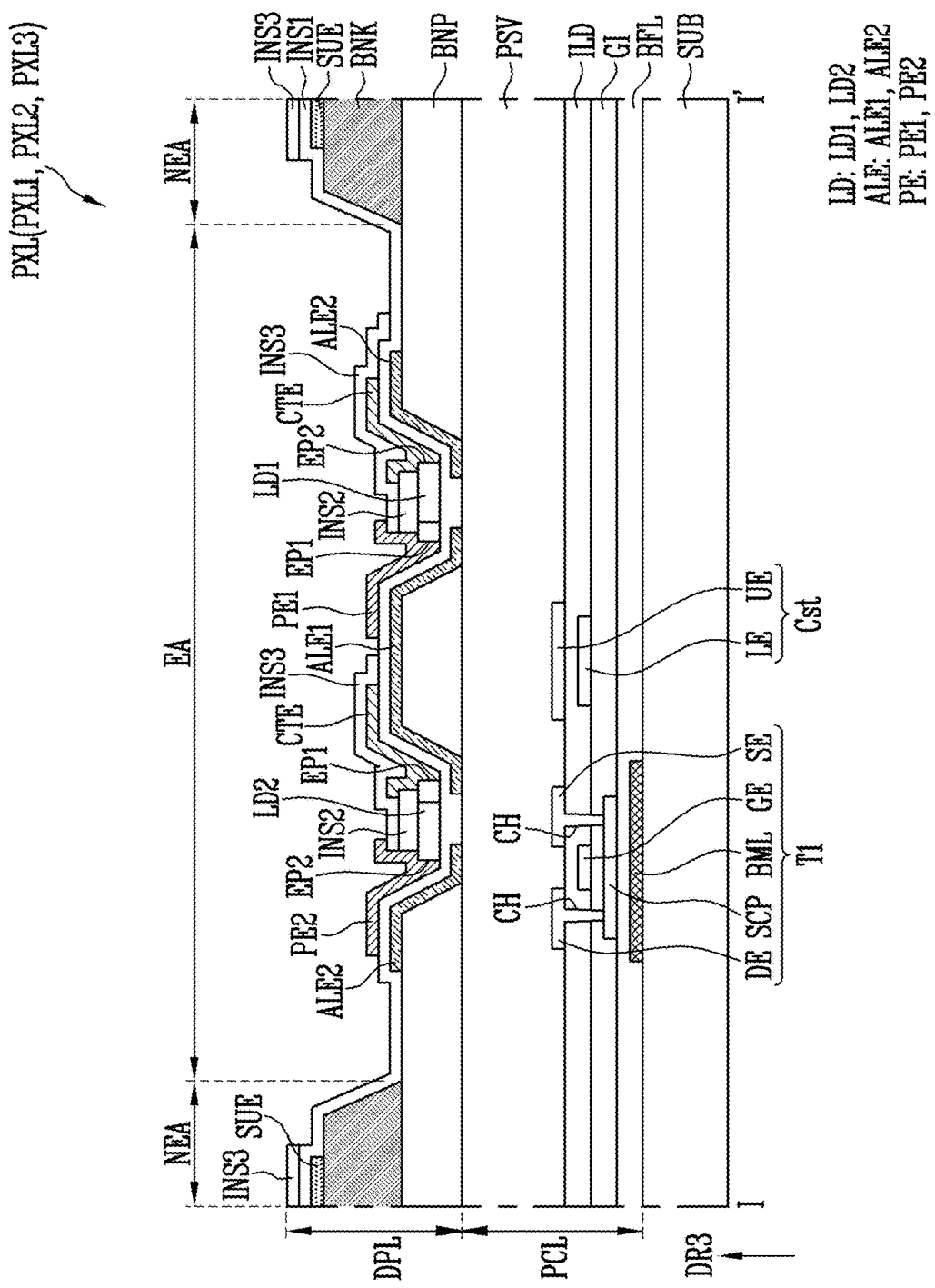
FIG. 12 is a cross-sectional view schematically illustrating another example of the cross-section taken along the line I-I' of FIGS. 7 and 8.
Figure 13:
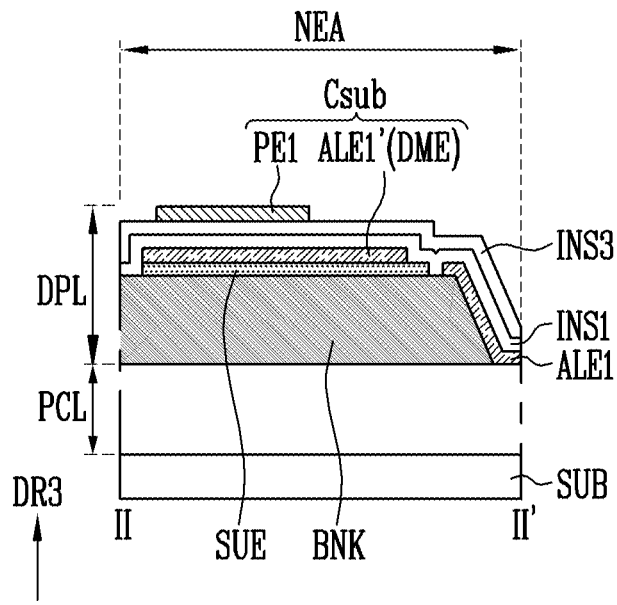
FIG. 13 is a cross-sectional view schematically illustrating another example of the cross-section taken along the line II-II' of FIGS. 7 and 8.

FIG. 12 is a cross-sectional view schematically illustrating another example of the cross-section taken along the line I-I' of FIGS. 7 and 8. FIG. 13 is a cross-sectional view schematically illustrating another example of the cross-section taken along the line II-II' of FIGS. 7 and 8.

The cross-sectional views of FIGS. 12 and 13 may be substantially the same as, or similar to, the stacked structures of FIGS. 6 and 9 except for the order in which the first insulating layer INS1 and the sub-electrode SUE are stacked. Therefore, a description of overlapping contents will be omitted.

Referring to FIGS. 5, 7, 8, 12, and 13, the sub-electrode SUE, the third insulating layer INS3, and the first pixel electrode PE1 may be sequentially located on the bank BNK of the non-emission area NEA.

The sub-electrode SUE may be directly located on the bank BNK.

In one or more embodiments, at least one of the first alignment electrode ALE1 and the second alignment electrode ALE2 may include a portion in contact with an upper surface of the sub-electrode SUE. For example, after the bank BNK and the sub-electrode SUE are formed, the first alignment electrode ALE1 and the second alignment electrode ALE2 may be patterned.

The first insulating layer INS1 may cover the first alignment electrode ALE1 and the second alignment electrode ALE2. In one or more embodiments, the first insulating layer INS1 may extend over the bank BNK. For example, in the non-emission area NEA, the first insulating layer INS1 may be located on the sub-electrode SUE, a first alignment electrode ALE1', and the second alignment electrode ALE2 on the bank BNK.

In one or more embodiments, in the non-emission area NEA, the third insulating layer INS3 may be located on the first insulating layer. Also, in the non-emission area NEA, the first pixel electrode PE1 may be located to overlap the sub-electrode SUE and the first alignment electrode ALE1' with the third insulating layer INS3 interposed therebetween. In this case, the first alignment electrode ALE1' in contact with the sub-electrode SUE may have a form of a dummy electrode DME floating with respect to other electrodes. Accordingly, the first alignment electrode ALE1' (that is, the dummy electrode DME) in contact with the sub-electrode SUE may not be connected to the first pixel electrode PE1.

Accordingly, the first pixel electrode PE1 may correspond to one electrode of the sub-capacitor Csub, and the dummy electrode DME and the sub-electrode SUE may correspond to the other electrode of the sub-capacitor Csub.

As described above, the alignment electrode ALE may be located on the bank BNK and the sub-electrode SUE according to a process sequence or manufacturing conditions of the display device.

Figure 14:
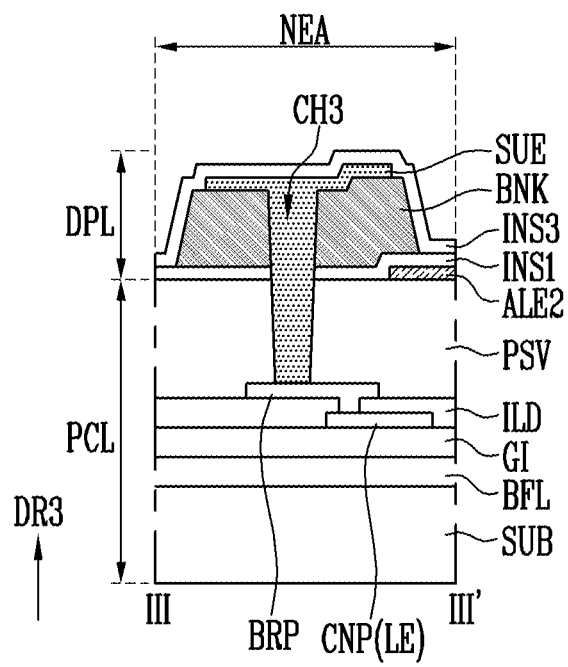
FIG. 14 is a cross-sectional view schematically illustrating an example of a cross-section taken along the line III-III' of FIGS. 7 and 8.

FIG. 14 is a cross-sectional view schematically illustrating an example of a cross-section taken along the line III-III' of FIGS. 7 and 8.

Referring to FIGS. 5, 6, 7, 8, and 14, the sub-electrode SUE may be located on the bank BNK of the non-emission area NEA.

The cross-sectional view of FIG. 14 may be understood as a conceptual diagram showing an example in which the sub-electrode SUE and the lower electrode LE of the storage capacitor Cst are electrically connected to each other. For example, in FIG. 14, a bridge pattern BRP and/or a connection pattern CNP are shown to be located in the non-emission area NEA. However, this is only an example, and the sub-electrode SUE may be electrically connected to the lower electrode LE of the capacitor Cst and the gate electrode of the first transistor T1 through the bridge pattern BRP and/or the connection pattern CNP. Also, at least one of the sub-electrode SUE, the bridge pattern BRP, and the connection pattern CNP might not overlap the rest.

In one or more embodiments, the second alignment electrode ALE2 may extend below the bank BNK. The first insulating layer INS1 may be located between the bank BNK and the second alignment electrode ALE2. The first insulating layer INS1 may cover the second alignment electrode ALE2 in at least a portion of the non-emission area NEA, and may be directly located on the passivation layer PSV. Also, in one or more embodiments, the first insulating layer INS1 may cover the first alignment electrode ALE1 in at least a portion of the non-emission area NEA.

The sub-electrode SUE may be located on the bank BNK. The sub-electrode SUE may include an opaque conductive material. The sub-electrode SUE may be connected to the bridge pattern BRP through the third contact hole CH3 penetrating the bank BNK, the first insulating layer INS1, and the passivation layer PSV.

In one or more embodiments, the bridge pattern BRP may be electrically connected to the lower electrode LE of the storage capacitor Cst. The bridge pattern BRP may include a conductive material. For example, the bridge pattern BRP may include one of, or a mixture selected from the group consisting of, molybdenum (Mo), tungsten (W), aluminum neodymium (AlNd), titanium (Ti), aluminum (Al), silver (Ag), and alloys thereof, and may be formed in a single-layer or multi-layer structure.

In one or more embodiments, the bridge pattern BRP may be located on the interlayer insulating layer ILD. The bridge pattern BRP may be electrically connected to the connection pattern CNP positioned below the bridge pattern BRP through a contact hole (e.g., predetermined contact hole). In FIG. 14, the contact hole connecting the bridge pattern BRP and the connection pattern CNP is located in the non-emission area NEA, but the present disclosure is not limited thereto. For example, the bridge pattern BRP may extend to the emission area EA, and the contact hole connecting the bridge pattern BRP and the connection pattern CNP (or the lower electrode LE of the capacitor Cst) may be formed in the emission area EA.

In one or more embodiments, the connection pattern CNP may be located on the gate insulating layer GI. The connection pattern CNP may be formed of the same material as the lower electrode LE of the capacitor Cst and as the gate electrode of the first transistor T1, and may be located on the same layer in the same process. For example, the connection pattern CNP may be electrically connected to the lower electrode LE of the capacitor Cst and the gate electrode of the first transistor T1. In other words, the connection pattern CNP may be defined by extending the lower electrode LE of the capacitor Cst and/or the gate electrode of the first transistor T1 to the non-emission area NEA. However, this is only an example, and the bridge pattern BRP may extend to the emission area EA, and the connection pattern CNP may be formed in the emission area EA.

As described above, because the sub-electrode SUE is electrically connected to the lower electrode LE of the storage capacitor Cst, the sub-electrode SUE may correspond to an electrode of the sub-capacitor Csub.

Figure 15:
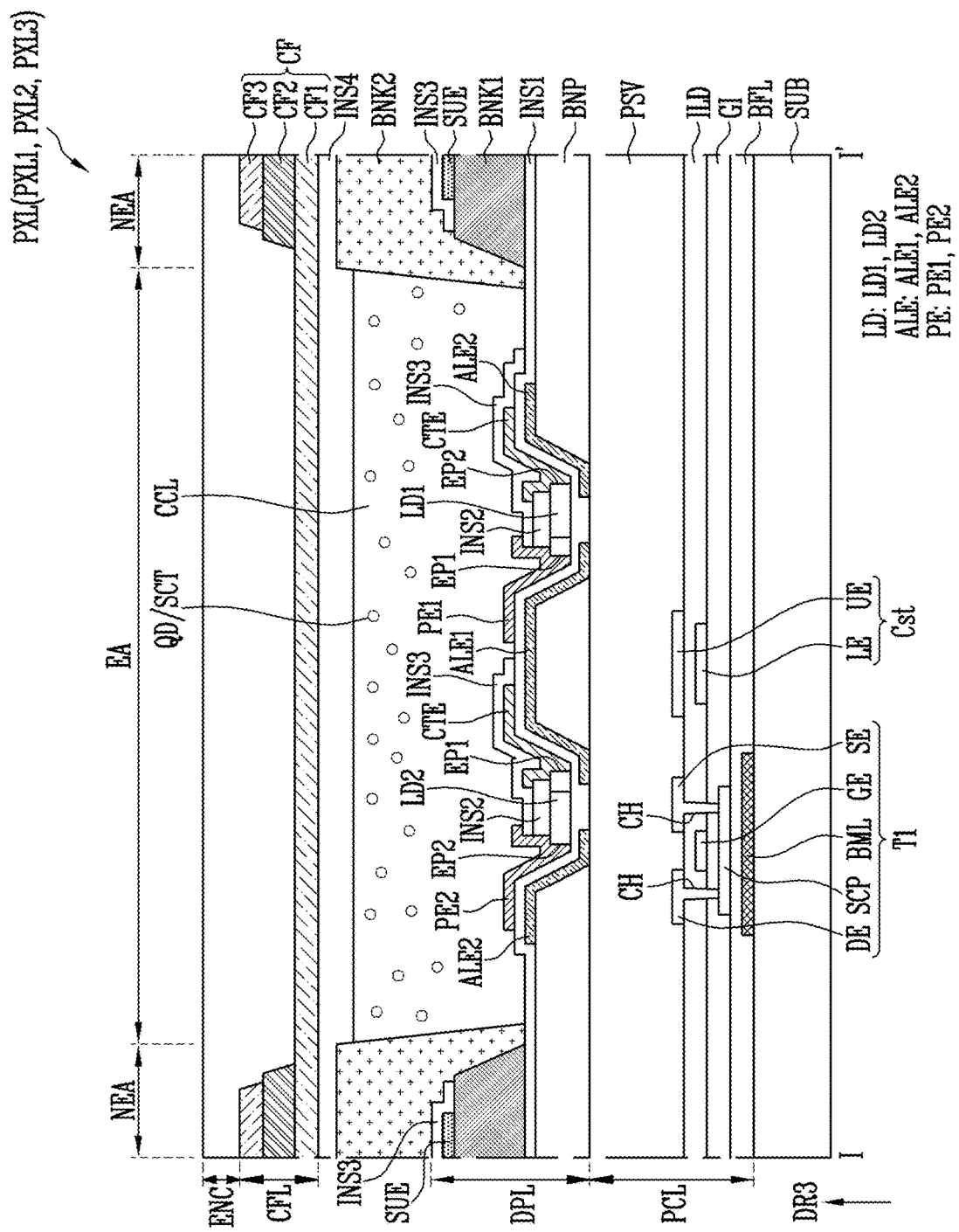
FIG. 15 is a cross-sectional view schematically illustrating an example of the stacked structure of the pixel of FIG. 5.

FIG. 15 is a cross-sectional view schematically illustrating an example of the stacked structure of the pixel of FIG. 5.

The cross-sectional view of FIG. 15 may be substantially the same as, or similar to, the stacked structures of FIGS. 6 and 9 except for the structure of the display element layer DPL on the third insulating layer INS3, a color filter layer CFL, and an encapsulation layer ENC. Therefore, a description of overlapping contents will be omitted.

Referring to FIG. 15, the pixel PXL may include the emission area EA, and the non-emission area NEA adjacent to the emission area EA. The pixel PXL and the display device including the same may include the substrate SUB, the pixel circuit layer PCL, the display element layer DPL, the color filter layer CFL, and the encapsulation layer CFL.

A first bank BNK1 may have the same configuration as the bank BNK described with reference to FIG. 6 and the like.

The display element layer DPL of the pixel PXL may further include a color conversion layer CCL positioned in the emission area EA, and a second bank BNK2 positioned in the non-emission area NEA.

The second bank BNK2 may be provided on the first bank BNK1. The second bank BNK2 may surround the emission area EA, and may define a position of the color conversion layer CCL.

The second bank BNK2 may include a light-blocking material. For example, the second bank BNK2 may be a black matrix. According to one or more embodiments, the second bank BNK2 may include at least one light-blocking material and/or reflective material to improve light output efficiency of the color conversion layer CCL.

The color conversion layer CCL may be formed on the first pixel electrode PE1, the second pixel electrode PE2, and the intermediate electrode CTE in the emission area EA.

The color conversion layer CCL may include color conversion particles QD corresponding to a corresponding color. For example, the color conversion layer CCL may include color conversion particles QD that convert light of a first color emitted from the light emitting element LD into light of a second color (or a corresponding color).

For example, when the pixel PXL is a red pixel, the color conversion layer CCL of the corresponding pixel PXL may include color conversion particles QD of red quantum dots that convert light emitted from the light emitting elements LD into red light.

According to one or more embodiments, when the light emitting element LD emits blue light and the pixel PXL is a blue pixel, a light scattering layer including light scattering particles SCT or a transparent polymer may be provided instead of the color conversion layer CCL including the color conversion particles QD.

A fourth insulating layer INS4 may be provided on the color conversion layer CCL and the second bank BNK2.

The fourth insulating layer INS4 may cover the second bank BNK2 and the color conversion layer CCL. The fourth insulating layer INS4 may be an inorganic layer (or an inorganic insulating layer) including an inorganic material.

The fourth insulating layer INS4 may completely cover the second bank BNK2 and the color conversion layer CCL to block moisture or the like from flowing into the display element layer DPL from outside.

The fourth insulating layer INS4 may have a flat surface while alleviating a step difference generated by the components located thereunder. For example, the fourth insulating layer INS4 may further include an organic layer including an organic material.

The color filter layer CFL may be provided on the fourth insulating layer INS4.

In one or more embodiments, the color filter layer CFL may include color filters CF respectively corresponding to the colors of the first, second, and third pixels PXL1, PXL2, and PXL3. For example, the color filter layer CFL may include a first color filter CF1 located on the color conversion layer CCL of the first pixel PXL1, a second color filter CF2 located on the color conversion layer CCL of the second pixel PXL2, and a third color filter CF3 located on the color conversion layer CCL of the third pixel PXL3.

In one or more embodiments, the first, second, and third color filters CF1, CF2, and CF3 may be located to overlap each other in the non-emission area NEA to block light interference between adjacent pixels PXL. Each of the first, second, and third color filters CF1, CF2, and CF3 may include a color filter material that selectively transmits light of a corresponding color converted by the color conversion layer CCL. For example, the first color filter CF1 may be a red color filter, the second color filter CF2 may be a green color filter, and the third color filter CF3 may be a blue color filter. The above-described color filters CF may be provided on one surface of the fourth insulating layer INS4 to correspond to the color conversion layer CCL.

However, this is only an example, and a light-blocking material for reducing or preventing light leakage between adjacent pixels PXL may be further located in the non-emission area NEA of the color filter layer CFL.

The encapsulation layer ENC may include an insulating layer. The insulating layer may be an inorganic insulating layer including an inorganic material and/or an organic insulating layer including an organic material. The encapsulation layer ENC may completely cover the components positioned thereunder to block moisture or the like from flowing into the color filter layer CFL and the display element layer DPL from outside.

In one or more embodiments, the encapsulation layer ENC may be formed of a multi-layer. For example, the encapsulation layer ENC may include at least two inorganic insulating layers, and at least one organic insulating layer interposed between the at least two inorganic insulating layers. However, the material and/or structure constituting the encapsulation layer ENC may be variously changed. In addition, according to one or more embodiments, at least one overcoat layer, filler layer, and/or upper substrate may be further located on the encapsulation layer ENC.

Figure 16:
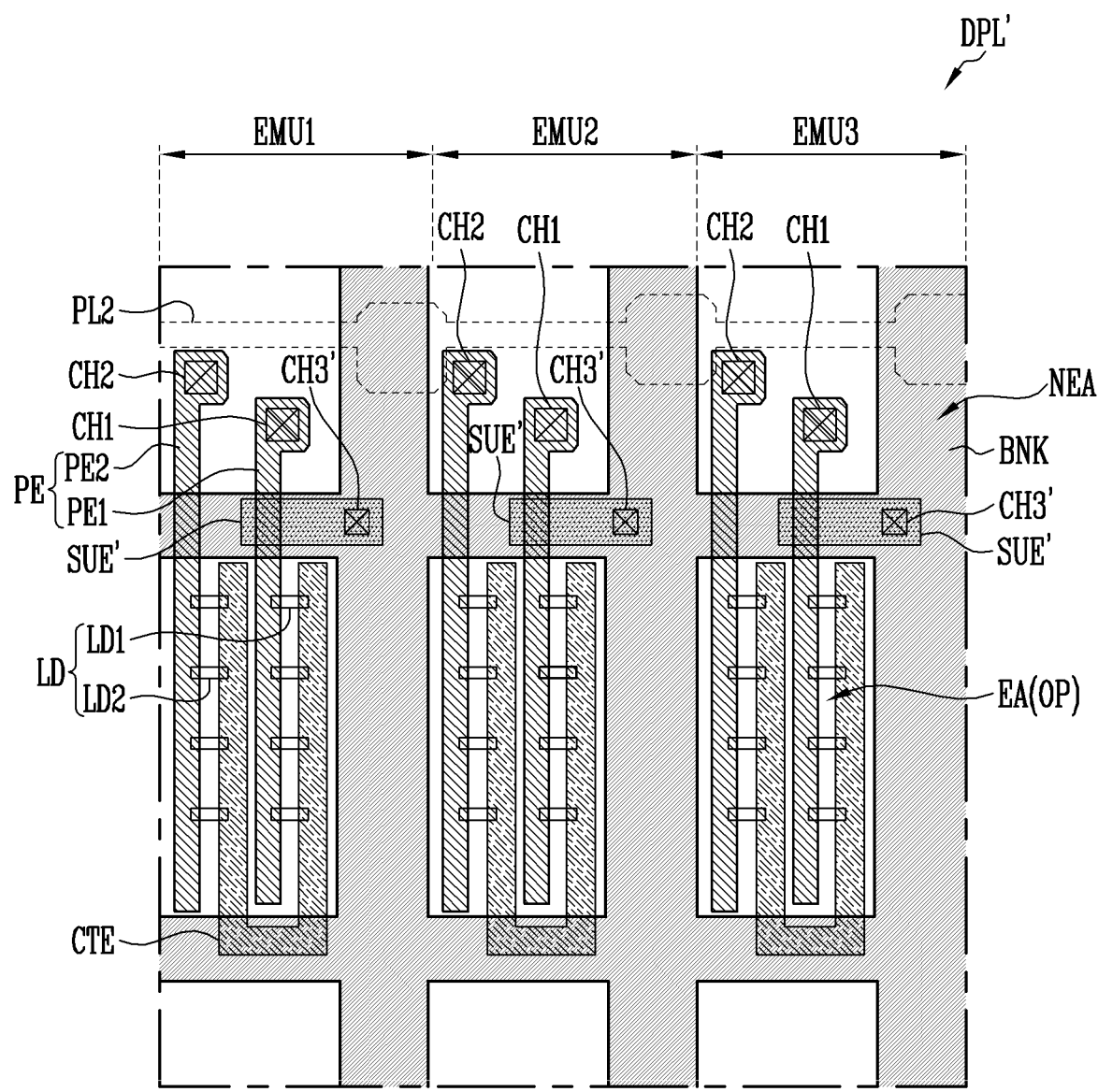
FIG. 16 is a plan view schematically illustrating another example of the display element layer of the pixel of FIG. 5.

FIG. 16 is a plan view schematically illustrating another example of the display element layer of the pixel of FIG. 5.

The display element layer DPL' of FIG. 16 may be substantially the same as, or similar to, the planar structure of the display element layer DPL described with reference to FIGS. 7 and 8 except for the shape of a sub-electrode SUE' and the position of a third contact hole CH3'. Therefore, a description of overlapping contents will be omitted.

Referring to FIGS. 5, 6, and 16, the display element layer DPL of the pixel PXL may include the alignment electrode ALE, the light emitting element LD, the pixel electrode PE, and the sub-electrode SUE'. Also, the display element layer DPL may further include the bank BNK located in the non-emission area NEA.

In one or more embodiments, the sub-electrode SUE' may overlap the first pixel electrode PE1 on the bank BNK, and may extend in the first direction DR1. For example, the sub-electrode SUE' may have a bar shape extending in the first direction DR1.

The sub-electrode SUE' may be electrically connected to the lower electrode LE of the storage capacitor Cst and to the gate electrode of the first transistor T1 through the third contact hole CH3'.

As described above, the sub-electrode SUE' may have various planar shapes on the bank BNK according to process conditions and the like.

FIGS. 17 to 22 are cross-sectional views illustrating a method of manufacturing a display device according to embodiments of the present disclosure.

Referring to FIGS. 17 to 22, a method of manufacturing a display device may include forming a pixel circuit layer PCL of a pixel including an emission area EA and a non-emission area NEA on a substrate SUB, forming a first alignment electrode ALE1 and a second alignment electrode ALE2 on the pixel circuit layer PCL, forming a bank BNK in the non-emission area NEA, providing and aligning a light emitting element LD, and sequentially forming a sub-electrode SUE, an intermediate electrode CTE, and a pixel electrode PE.

Figure 17:
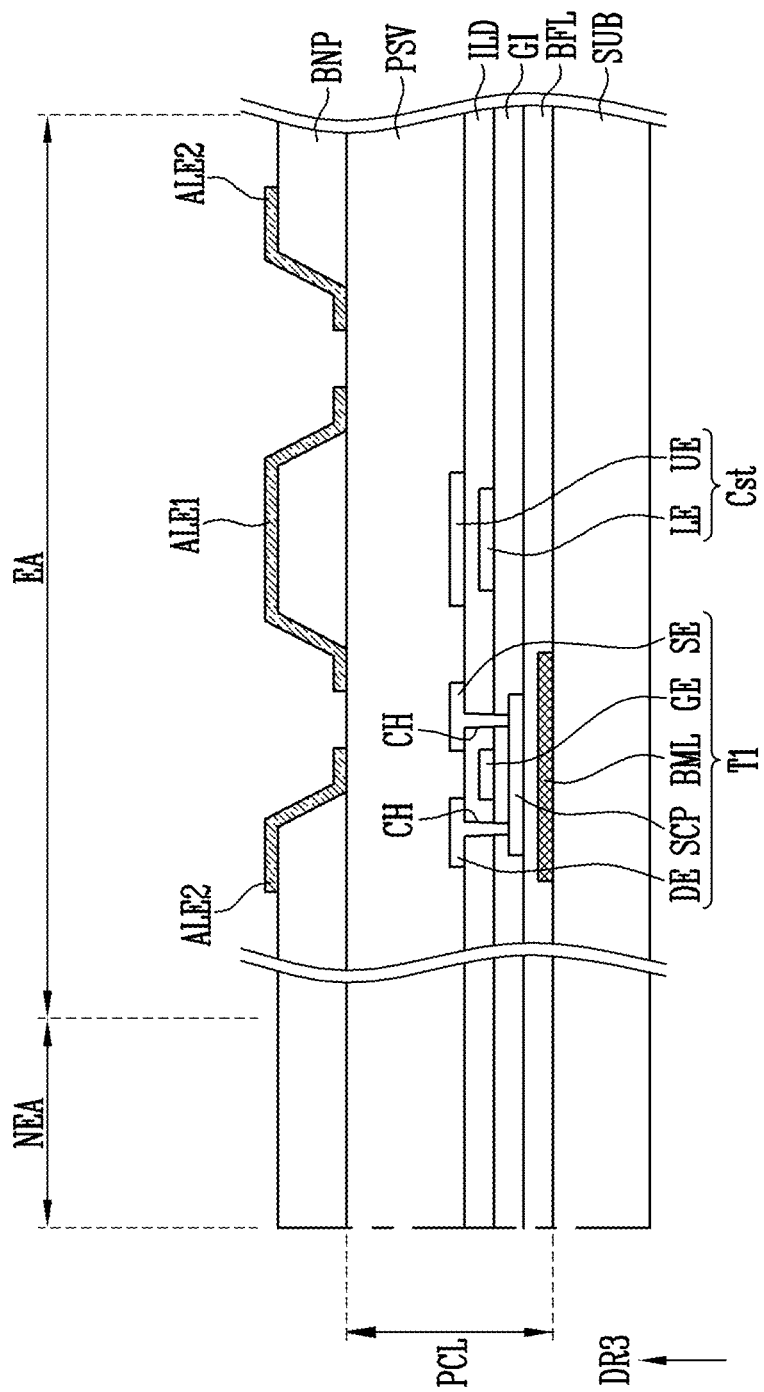
FIGS. 17 to 22 are cross-sectional views illustrating a method of manufacturing a display device according to embodiments of the present disclosure.

As shown in FIG. 17, the pixel circuit layer PCL may be formed on the substrate SUB, a bank pattern BNP including/defining openings (e.g., predetermined openings) may be formed on the pixel circuit layer PCL, and the first alignment electrode ALE1 and the second alignment electrode ALE2 may be formed to cover a portion of the bank pattern BNP.

The pixel circuit layer PCL may include a pixel circuit including a first transistor T1 and a storage capacitor Cst. Because the structure and process of the pixel circuit layer PCL have been described with reference to FIG. 6, duplicate descriptions thereof will be omitted.

The bank pattern BNP may be formed on a passivation layer PSV of the pixel circuit layer PCL. The bank pattern BNP may be an inorganic layer including an inorganic material, or may be an organic layer including an organic material. According to one or more embodiments, the bank pattern BNP may include a single-layered organic layer and/or a single-layered inorganic layer, but the present disclosure is not limited thereto.

In one or more embodiments, the bank pattern BNP may be formed by depositing an inorganic or organic insulating material through a coating process, and by then patterning the insulating material through an etching (for example, wet etching) process. The bank pattern BNP may be formed without distinguishing between the emission area EA and the non-emission area NEA. However, this is only an example, and the process of forming the bank pattern BNP is not limited thereto.

Thereafter, a conductive material may be deposited on the bank pattern BNP and the passivation layer through a sputtering process, and then the first alignment electrode ALE1 and the second alignment electrode ALE2 may be formed by etching the conductive material through an etching (for example, dry etching) process. However, this is only an example, and the process of forming the first alignment electrode ALE1 and the second alignment electrode ALE2 is not limited thereto. The first alignment electrode ALE1 and the second alignment electrode ALE2 may be formed along the profile of an upper surface of the bank pattern BNP.

Figure 18:
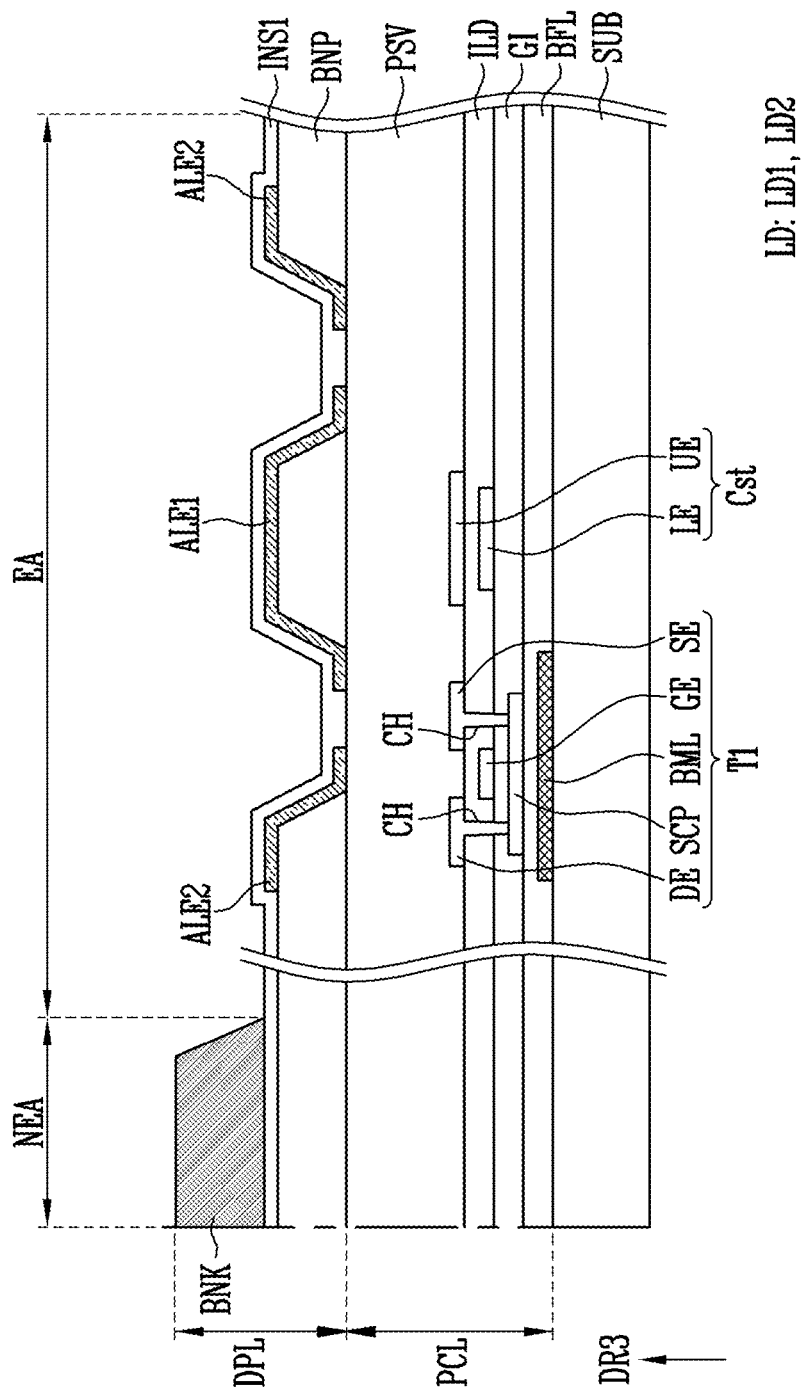

Thereafter, as shown in FIG. 18, a first insulating layer INS1 may be formed, and the bank BNK may be formed in the non-emission area NEA.

The first insulating layer INS1 may include an inorganic insulating material and/or an organic insulating material. The first insulating layer INS1 may cover the first alignment electrode ALE1 and the second alignment electrode ALE2.

In one or more embodiments, after an insulating material is deposited by a chemical vapor deposition method, the first insulating layer INS1 may be formed through an etching process. However, this is only an example, and the process of forming the first insulating layer INS1 is not limited thereto. In one or more embodiments, the first insulating layer INS1 may include contact holes exposing portions of the first alignment electrode ALE1 and the second alignment electrode ALE2.

The bank BNK may include a light-blocking material. In one or more embodiments, the bank BNK may be formed to have/define an opening corresponding to the emission area EA through a photo process and/or a dry etching process for an organic light-blocking material.

In addition, a contact hole (for example, the third contact hole CH3 of FIG. 7) may be formed together in the bank BNK so that the sub-electrode SUE is electrically connected to a gate electrode GE and a lower electrode LE of the pixel circuit layer PCL.

Figure 19:
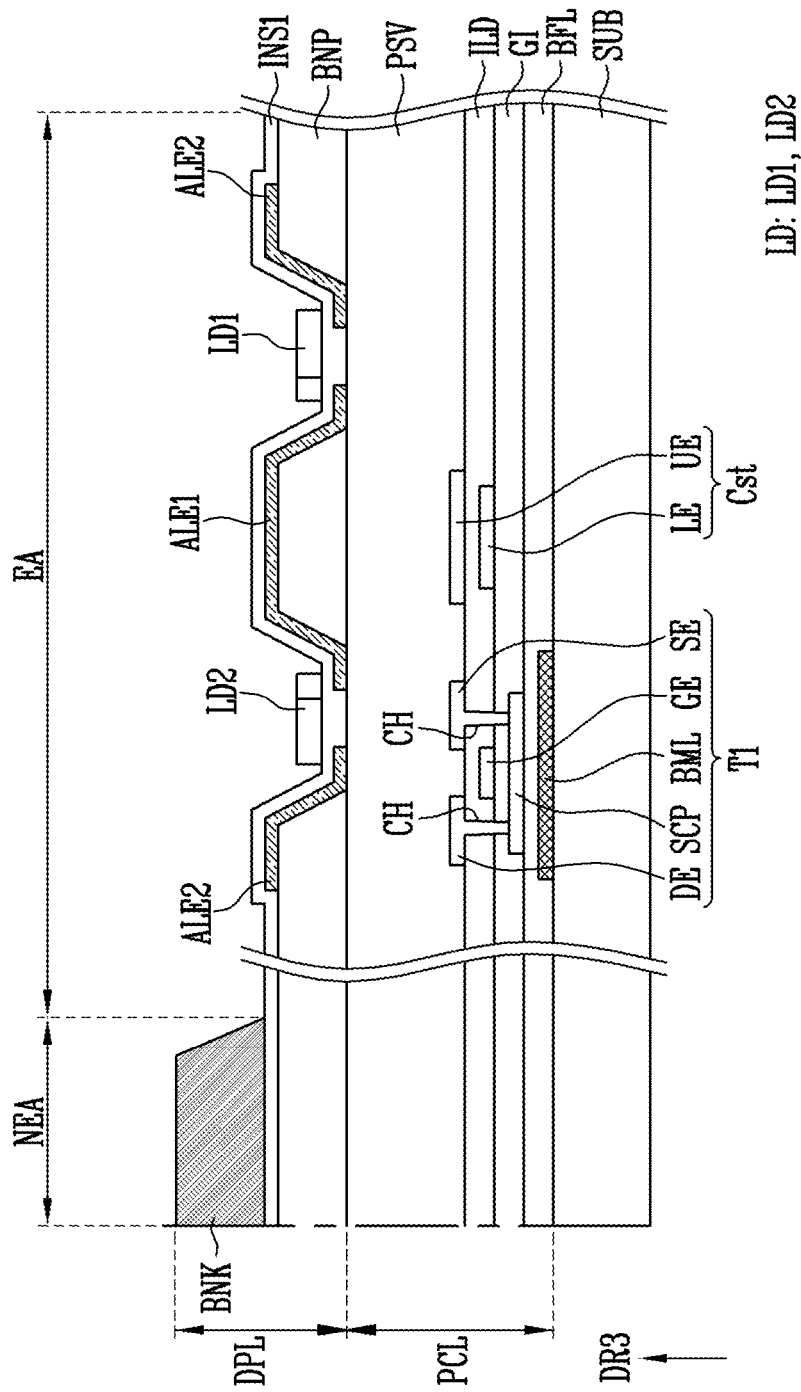

As shown in FIG. 19, light emitting elements LD may be provided on the first insulating layer INS1 of the emission area EA. The light emitting elements LD may be provided in a recess between bank patterns BNP.

The light emitting elements LD may be input (or supplied) into the emission area EA through an inkjet printing method, a slit coating method, or other various methods. For example, the light emitting elements LD may be mixed with a volatile solvent and may be provided to the emission area EA through an inkjet printing method or a slit coating method.

When different alignment signals are applied to the first alignment electrode ALE1 and the second alignment electrode ALE2, an electric field may be formed between them. Accordingly, the light emitting elements LD may be aligned between the first alignment electrode ALE1 and the second alignment electrode ALE2, respectively. After the light emitting elements LD are aligned, the light emitting elements LD may be stably aligned by removing the solvent.

For example, a p-type semiconductor layer of a first light emitting element LD1 and a p-type semiconductor layer of a second light emitting element LD2 may be aligned to overlap the first alignment electrode ALE1, and an n-type semiconductor layer of the first light emitting element LD1 and an n-type semiconductor layer of the second light emitting element LD2 may be aligned to overlap the second alignment electrodes ALE2. A first end EP1 may be positioned in the p-type semiconductor layer of each of the first and second light emitting elements LD1 and LD2, and a second end EP2 may be positioned in the n-type semiconductor layer of each of the first and second light emitting elements LD1 and LD2.

Figure 20:
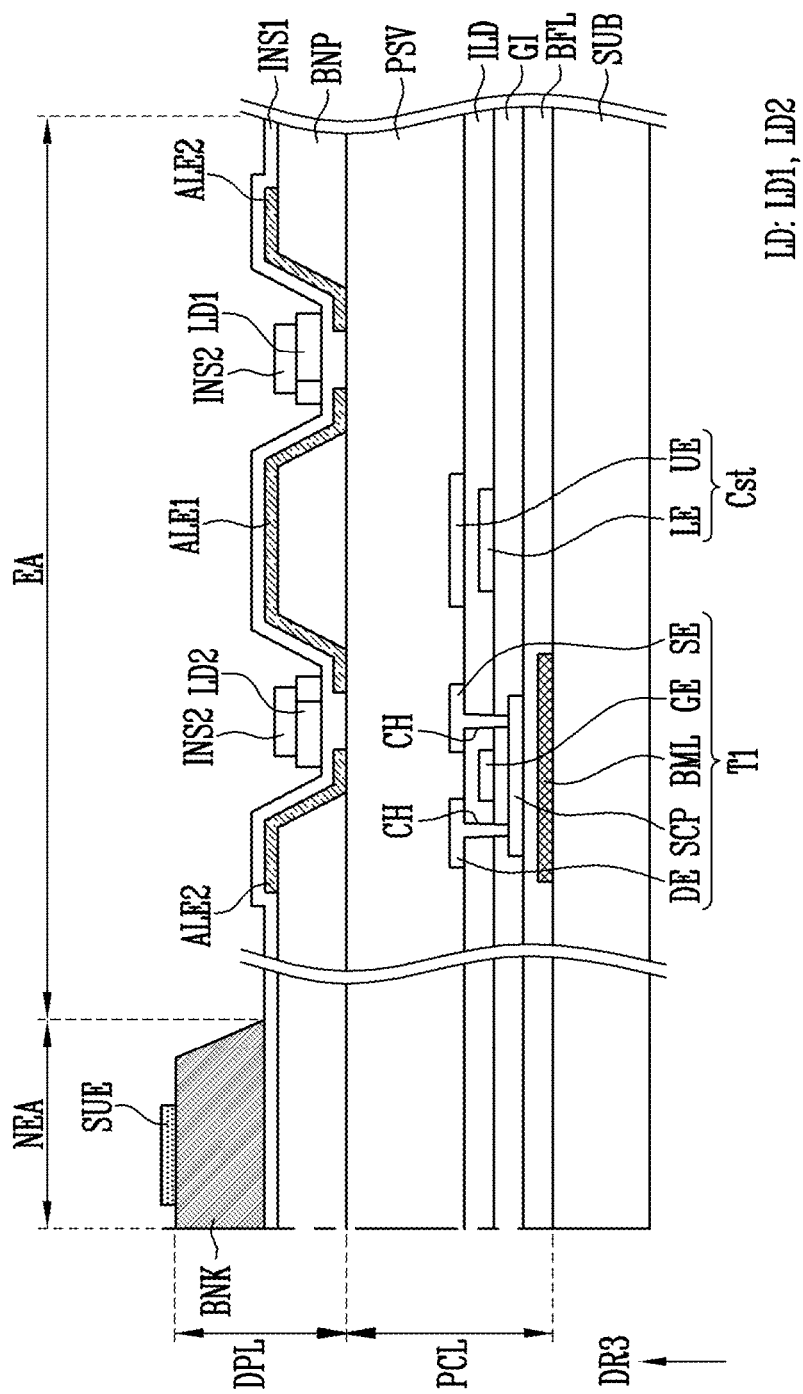

Referring to FIG. 20, the sub-electrode SUE may be formed on the bank BNK. In one or more embodiments, the sub-electrode SUE may be formed on the bank BNK through a process of sputtering and etching a conductive material. However, this is only an example, and the process of forming the sub-electrode SUE is not limited thereto.

Thereafter, a second insulating layer INS2 may be formed on the first and second light emitting elements LD1 and LD2. The second insulating layer INS2 may be formed to expose the first end EP1 and the second end EP2 of each of the first and second light emitting elements LD1 and LD2.

In one or more embodiments, after an insulating material is deposited by a chemical vapor deposition method, the second insulating layer INS2 may be formed through an etching process. However, this is only an example, and the process of forming the second insulating layer INS2 is not limited thereto.

Figure 21:
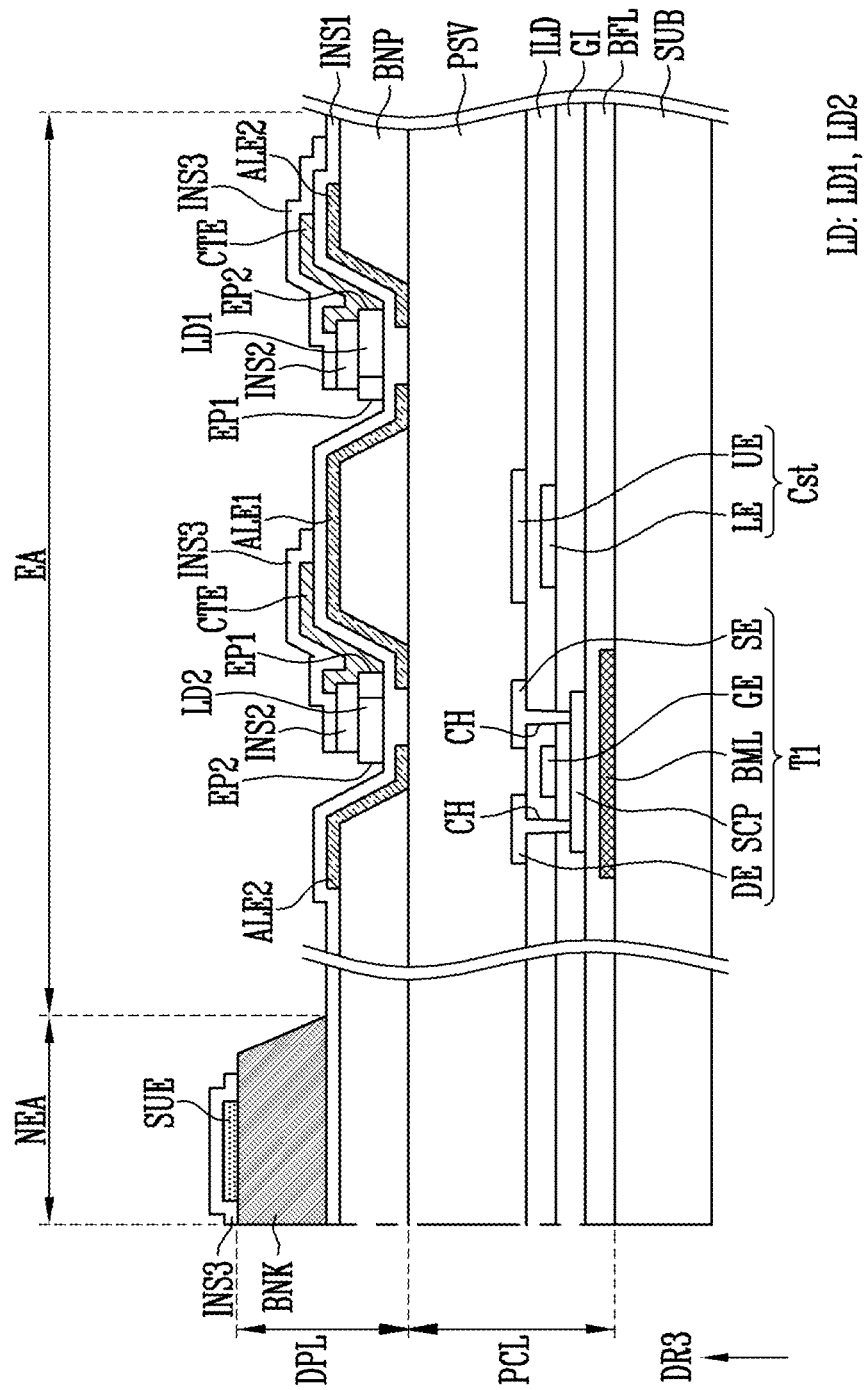

Thereafter, as shown in FIG. 21, an intermediate electrode CTE may be formed on the first insulating layer INS1 of the emission area EA, and a third insulation layer INS3 may be formed to cover the intermediate electrode CTE and the sub-electrode SUE.

The intermediate electrode CTE may be electrically connected to the second end EP2 of the first light emitting element LD1, and may be electrically connected to the first end EP1 of the second light emitting element LD2. For example, the intermediate electrode CTE may be in contact with the second end EP2 of the first light emitting element LD1 and with the first end EP1 of the second light emitting element LD2.

Also, the intermediate electrode CTE may cover a portion of the second insulating layer INS2.

The intermediate electrode CTE may be formed through a process of sputtering and etching a conductive material.

The third insulating layer INS3 may cover the entire intermediate electrode CTE and the entire sub-electrode SUE. In one or more embodiments, after an inorganic insulating material is deposited by a chemical vapor deposition method, the third insulating layer INS3 may be formed through an etching process. However, this is only an example, and the process of forming the third insulating layer INS3 is not limited thereto.

Figure 22:
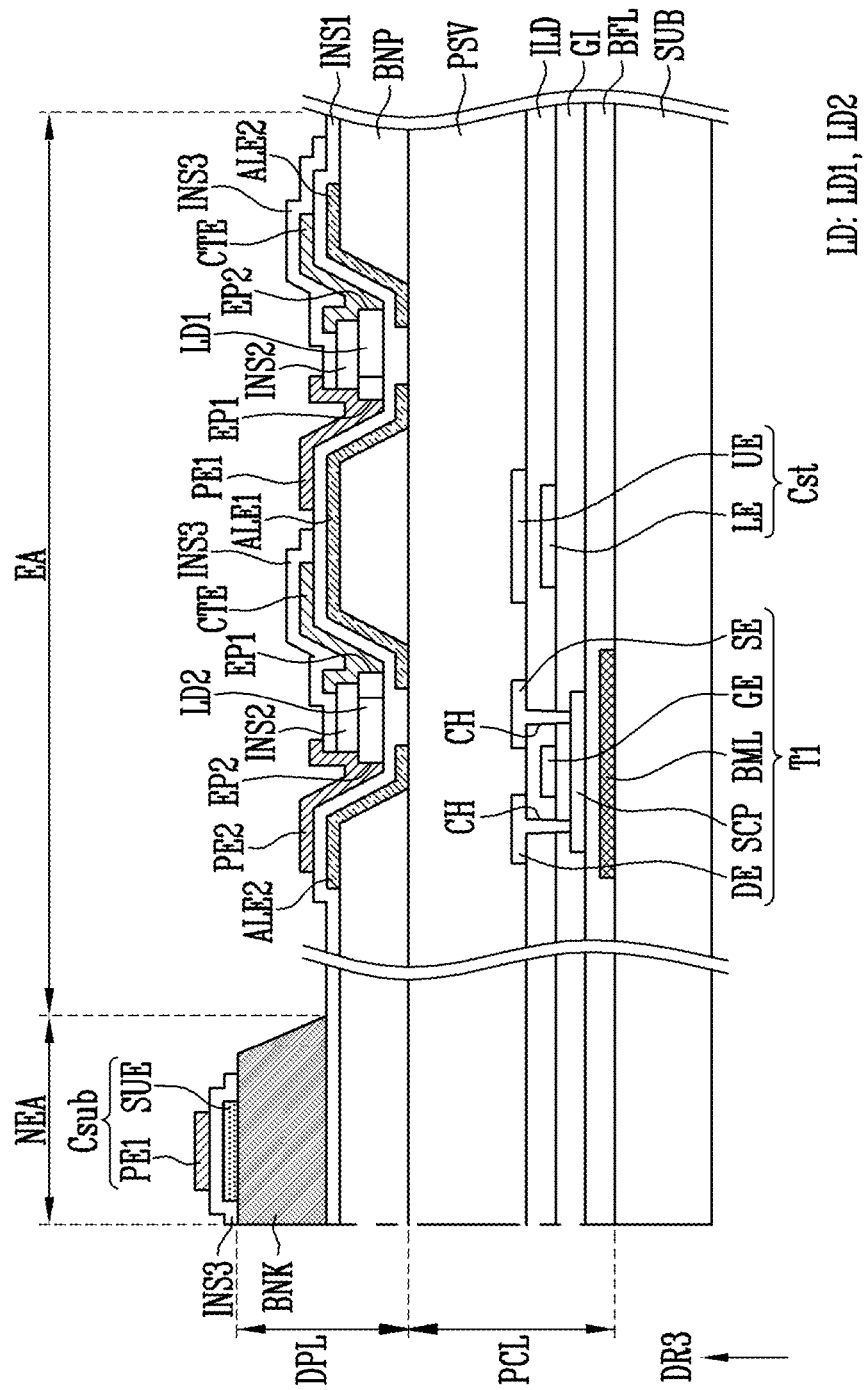

Thereafter, as shown in FIG. 22, the pixel electrode PE including a first pixel electrode PE1 and a second pixel electrode PE2 may be formed. That is, the first pixel electrode PE1 and the second pixel electrode PE2 may be concurrently or substantially simultaneously patterned.

In one or more embodiments, the pixel electrode PE may be formed through a process of sputtering and etching a conductive material. However, this is only an example, and the process of forming the pixel electrode PE is not limited thereto.

The first pixel electrode PE1 may be electrically connected to the first end EP1 of the first light emitting element LD1. The second pixel electrode PE2 may be electrically connected to the second end EP2 of the second light emitting element LD2.

Also, the first pixel electrode PE1 may overlap the sub-electrode SUE on the third insulating layer INS3 of the non-emission area NEA. Accordingly, a portion where the first pixel electrode PE1 and the sub-electrode SUE overlap may form a sub-capacitor Csub. The sub-capacitor Csub may be electrically connected to the storage capacitor Cst in parallel.

As described above, the pixel and the display device including the same according to the embodiments of the present disclosure may include the sub-electrode SUE and the first pixel electrode PE1 overlapping each other with the third insulating layer INS3 interposed therebetween on the bank BNK of the non-emission area NEA.

In addition, the method of manufacturing the display device according to the embodiments of the present disclosure may form the sub-capacitor Csub connected in parallel with the storage capacitor Cst through a process of forming the sub-electrode SUB on the bank BNK.

Accordingly, the equivalent capacitance for charging the data voltage may be increased. Thus, in a high-resolution display device having a high pixel density, a charging rate of the data voltage may be improved, and the SRU between neighboring pixels may be improved.

However, aspects of the present disclosure are not limited to the above-described aspects, and may be variously extended without departing from the spirit and scope of the present disclosure.

As described above, embodiments of the present disclosure have been described with reference to the drawings. However, those skilled in the art will appreciate that various modifications and changes can be made to the present disclosure without departing from the spirit and scope of the disclosure as set forth in the appended claims, with functional equivalents thereof to be included therein.

What is claimed is:

1. A display device comprising:
   a substrate divided into an emission area and a non-emission area;
   a storage capacitor above the substrate, and comprising a lower electrode and an upper electrode overlapping each other with an insulating layer interposed therebetween;
   a first insulating layer above the storage capacitor;
   a first light emitting element and a second light emitting element above the first insulating layer of the emission area;
   a bank in the non-emission area, and defining an opening corresponding to the emission area;
   a first pixel electrode electrically connected to a first end of the first light emitting element;
   a second pixel electrode electrically connected to a second end of the second light emitting element;
   an intermediate electrode comprising a portion positioned between the first pixel electrode and the second pixel electrode in a plan view, surrounding at least a portion of the first pixel electrode, and electrically connected to a second end of the first light emitting element and to a first end of the second light emitting element; and
   a sub-electrode above the bank, electrically connected to the lower electrode of the storage capacitor through a contact hole, and overlapping the first pixel electrode above the bank.

2. The display device of claim 1, further comprising:
   a second insulating layer directly on the first light emitting element and the second light emitting element, and exposing the first end and the second end of each of the first light emitting element and the second light emitting element; and
   a third insulating layer covering the intermediate electrode, and extending over the bank.

3. The display device of claim 2, wherein the first pixel electrode comprises a portion overlapping the sub-electrode with the third insulating layer interposed therebetween above the bank.

4. The display device of claim 3, wherein an area where the first pixel electrode and the sub-electrode overlap corresponds to a sub-capacitor.

5. The display device of claim 4, wherein the first pixel electrode is electrically connected to the upper electrode of the storage capacitor.

6. The display device of claim 4, further comprising a driving transistor above the substrate, and electrically connected to the storage capacitor and to the sub-capacitor,
wherein the storage capacitor and the sub-capacitor are electrically connected in parallel to each other between a gate electrode of the driving transistor and the first pixel electrode.

7. The display device of claim 2, wherein the first pixel electrode and the second pixel electrode are provided at a same layer.

8. The display device of claim 7, wherein the intermediate electrode is provided on a different layer from the first pixel electrode and the second pixel electrode.

9. The display device of claim 2, further comprising:
a first alignment electrode under the first insulating layer, and electrically connected to the first pixel electrode; and
a second alignment electrode under the first insulating layer, spaced apart from the first alignment electrode, and electrically connected to the second pixel electrode.

10. The display device of claim 9, wherein the bank is above the first insulating layer in the non-emission area.

11. The display device of claim 9, wherein the first insulating layer is above the bank in the non-emission area.

12. The display device of claim 11, wherein at least one of the first alignment electrode and the second alignment electrode comprises a portion in contact with an upper surface of the sub-electrode.

13. A pixel comprising:
a storage capacitor above a substrate, and comprising a lower electrode and an upper electrode overlapping each other;
a first insulating layer above the storage capacitor;
a first light emitting element and a second light emitting element above the first insulating layer in an emission area;
a bank in a non-emission area, and defining an opening corresponding to the emission area;
a first pixel electrode electrically connected to a first end of the first light emitting element;
a second pixel electrode electrically connected to a second end of the second light emitting element;
an intermediate electrode comprising a portion positioned between the first pixel electrode and the second pixel electrode in a plan view, surrounding at least a portion of the first pixel electrode, and electrically connected to a second end of the first light emitting element and to a first end of the second light emitting element; and
a sub-electrode above the bank, electrically connected to the lower electrode of the storage capacitor through a contact hole, and overlapping the first pixel electrode above the bank.

* * * * *